United States Patent
Honkura et al.

(10) Patent No.: US 7,298,140 B2
(45) Date of Patent: Nov. 20, 2007

(54) THREE-DIMENSIONAL MAGNETIC DIRECTION SENSOR, AND MAGNETO-IMPEDANCE SENSOR ELEMENT

(75) Inventors: Yoshinobu Honkura, Aichi (JP); Michiharu Yamamoto, Aichi (JP); Kouei Genba, Aichi (JP)

(73) Assignee: Aichi Steel Corporation, Tokai-shi (JP)

( * ) Notice: Subject to any disclaimer, the term of this patent is extended or adjusted under 35 U.S.C. 154(b) by 98 days.

(21) Appl. No.: 10/523,807

(22) PCT Filed: Jul. 13, 2004

(86) PCT No.: PCT/JP2004/009972

§ 371 (c)(1),
(2), (4) Date: Feb. 8, 2005

(87) PCT Pub. No.: WO2005/008268

PCT Pub. Date: Jan. 27, 2005

(65) Prior Publication Data
US 2005/0242805 A1   Nov. 3, 2005

(30) Foreign Application Priority Data
Jul. 18, 2003   (JP)   ............................. 2003-199533

(51) Int. Cl.
*G01R 33/02*   (2006.01)

(52) U.S. Cl. ....................... 324/249; 324/247; 324/253

(58) Field of Classification Search ...................... None
See application file for complete search history.

(56) References Cited

U.S. PATENT DOCUMENTS

| 4,656,750 A | * | 4/1987 | Pitt et al. ....................... 33/352 |
| 4,939,459 A |   | 7/1990 | Akachi et al. |
| 5,644,230 A |   | 7/1997 | Pant et al. |
| 5,689,185 A | * | 11/1997 | Widdershoven et al. .... 324/252 |

(Continued)

FOREIGN PATENT DOCUMENTS

EP   1 293 792 A2   3/2003

(Continued)

OTHER PUBLICATIONS

U.S. Appl. No. 10/501,329, filed Feb. 2, 2005, Honkura et al.

(Continued)

*Primary Examiner*—Jay M Patidar
(74) *Attorney, Agent, or Firm*—Oblon, Spivak, McClelland, Maier & Neustadt, P.C.

(57) ABSTRACT

A three-dimensional magnetic bearing sensor 10a includes a first sensor 101, a second sensor 102, and a third sensor 103 each constituted by a magneto-impedance sensor element 10 comprising a magnetic sensitive member 2 having a characteristic changed responsive to an external magnetic field, an insulator 4 formed to allow penetration of the magnetic sensitive member 2 therethrough, and an electromagnetic coil 3 made up of foil-like conductive patterns 31, 32 arranged in adjacent relation on an outer surface of the insulator 4. The first sensor 101, the second sensor 102, and the third sensor 103 are disposed such that directions in which the magnetic sensitive members 2 in respective sensors have maximum magnetic field detection sensitivities are substantially orthogonal to each other.

13 Claims, 18 Drawing Sheets

U.S. PATENT DOCUMENTS

| | | |
|---|---|---|
| 5,831,432 A | 11/1998 | Mohri |
| 5,850,624 A * | 12/1998 | Gard et al. .................... 702/92 |
| 5,924,212 A * | 7/1999 | Domanski ................ 33/355 R |
| 6,028,427 A | 2/2000 | Kawase |
| 6,069,475 A | 5/2000 | Isomura et al. |
| 6,229,307 B1 | 5/2001 | Umehara et al. |
| 6,232,775 B1 | 5/2001 | Naitoh et al. |
| 6,472,868 B1 * | 10/2002 | Takayama et al. .......... 324/249 |
| 6,650,112 B2 * | 11/2003 | Takayama et al. .......... 324/249 |
| 6,831,457 B2 * | 12/2004 | Honkura et al. ........... 324/249 |
| 6,968,273 B2 * | 11/2005 | Ockerse et al. ............. 701/224 |
| 6,984,989 B2 * | 1/2006 | Kudo et al. ................. 324/529 |
| 2001/0030537 A1 | 10/2001 | Honkura et al. |
| 2004/0124835 A1 * | 7/2004 | Kimura ...................... 324/249 |

FOREIGN PATENT DOCUMENTS

| | | |
|---|---|---|
| JP | 2-111085 | 4/1990 |
| JP | 06-176930 | 6/1994 |
| JP | 07-181239 | 7/1995 |
| JP | 8-029509 | 2/1996 |
| JP | 09-080133 | 3/1997 |
| JP | 10-010215 | 1/1998 |
| JP | 11-064473 | 3/1999 |
| JP | 2000-081471 | 3/2000 |
| JP | 2001-133530 | 5/2001 |
| JP | 2001-296127 | 10/2001 |
| JP | 2001-318131 | 11/2001 |
| JP | 2003-167037 | 6/2003 |

OTHER PUBLICATIONS

U.S. Appl. No. 10/523,807, filed Feb. 8, 2005, Honkura et al.

* cited by examiner characteristic of X-axis and Y-axis characteristic of X-axis and Z-axis characteristic of Y-axis and Z-axis

US 7,298,140 B2

THREE-DIMENSIONAL MAGNETIC DIRECTION SENSOR, AND MAGNETO-IMPEDANCE SENSOR ELEMENT

TECHNICAL FIELD

The present invention relates to a three-dimensional magnetic bearing sensor and a magneto-impedance sensor element, which can be applied to an electronic compass.

BACKGROUND ART

Hitherto, there is known a magnetic sensor wherein a one-piece element holding an amorphous wire as a magnetic sensitive member therein is inserted in a tubular bobbin around which a detection coil and a negative feedback coil are wound (see, e.g., Patent Document 1). The one-piece element is manufactured, for example, by arranging the amorphous wire between electrodes disposed at opposite ends of a substrate in its lengthwise direction, and by covering the entire substrate with a gel-like material.

Further, a magnetic bearing sensor comprising two or three sets of thus-constructed magnetic sensors is also known. In that magnetic bearing sensor, individual magnetic sensors are arranged such that the axial directions of respective amorphous wires are substantially orthogonal to each other (see, e.g., Patent Document 2).

Patent Document 1: Japanese Unexamined Patent Application Publication No. 2001-296127

Patent Document 2: Japanese Unexamined Patent Application Publication No. 11-64473

DISCLOSURE OF THE INVENTION

Problems to be Solved by the Invention

However, the known magnetic sensor has the following problems. The magnetic sensor has the structure that the one-piece element having the amorphous wire arranged on the substrate is employed and it is inserted in the tubular bobbin for placement therein. Accordingly, the number of parts and the number of manufacturing steps are increased, and the manufacturing and assembly steps are complicated. Thus, the known magnetic sensor is not adapted for a reduction in size and cost of the sensor.

Also, the known magnetic bearing sensor comprising three sets of magnetic sensors each constructed as described above has the following problems. In addition to an insufficient reduction in size and cost as in the known magnetic sensor, the magnetic bearing sensor comprising three sets of magnetic sensors necessarily accompanies a risk of further enlarging the bulk and increasing the cost.

Means for Solving the Problems

A first aspect of the present invention resides in a three-dimensional magnetic bearing sensor including a first sensor, a second sensor, and a third sensor each constituted by a magneto-impedance sensor element comprising a magnetic sensitive member having a characteristic changed responsive to an external magnetic field, an insulator formed to allow penetration of the magnetic sensitive member therethrough, and an electromagnetic coil made up of foil-like conductive patterns arranged in adjacent relation on an outer surface of the insulator, wherein the first sensor, the second sensor, and the third sensor are disposed such that directions in which the magnetic sensitive members in respective sensors have maximum magnetic field detection sensitivities are substantially orthogonal to each other.

The three-dimensional magnetic bearing sensor according to the first aspect of the present invention is constituted by employing the first sensor, the second sensor, and the third sensor each constituted by the magneto-impedance sensor element comprising the magnetic sensitive member having a characteristic changed responsive to an external magnetic field, the insulator formed to allow penetration of the magnetic sensitive member therethrough, and the electromagnetic coil made up of the foil-like conductive patterns arranged in adjacent relation on the outer surface of the insulator. Further, in this three-dimensional magnetic bearing sensor, those sensors are disposed such that the directions in which the magnetic sensitive members in respective sensors have maximum magnetic sensitivities are substantially orthogonal to each other.

Here, the electromagnetic coil in each sensor is made up of the foil-like conductive patterns. The electromagnetic coil made up of the foil-like conductive patterns can be formed in small size with very high efficiency, for example, by a method using vapor deposition of a metal, a method of etching a metallic thin film and selectively removing the metallic thin film, or a method of coating conductive ink. Therefore, each sensor can be formed in small size and at a low cost. Further, with the electromagnetic coil formed of the conductive patterns, the accuracy in forming the electromagnetic coil is increased, whereby variations in characteristics can be reduced and a highly accurate sensor can be realized.

Moreover, in the three-dimensional magnetic bearing sensor, the first to third sensors are disposed such that the directions in which the magnetic sensitive members in respective sensors have maximum magnetic sensitivities are substantially orthogonal to each other. Accordingly, the three-dimensional magnetic bearing sensor employing those sensors each having high quality can be obtained as a superior product having a small size, a low cost and high accuracy.

Thus, the three-dimensional magnetic bearing sensor according to the first aspect of the present invention has succeeded in realizing not only easier manufacturing and assembly, but also a smaller size. Also, the three-dimensional magnetic bearing sensor enables highly accurate bearing detection to be performed regardless of its posture.

A second aspect of the present invention resides in a magneto-impedance sensor element made by winding an electromagnetic coil around a magnetic sensitive member having a characteristic changed responsive to an external magnetic field, wherein the magneto-impedance sensor element comprises a sensor substrate for holding the magnetic sensitive member, an insulator formed to allow penetration of the magnetic sensitive member therethrough, and an electromagnetic coil made up of foil-like conductive patterns arranged in adjacent relation on an outer surface of the insulator, and wherein the sensor substrate has electrodes extended from the electromagnetic coil and the magnetic sensitive member, the electrodes being formed on one of outer surfaces of the sensor substrate which is substantially orthogonal to the axial direction of the magnetic sensitive member.

The substrate in the magneto-impedance sensor element according to the second aspect of the present invention has the electrodes extended from the electromagnetic coil and the magnetic sensitive member, and the electrodes are formed on one of outer surfaces of the substrate which is substantially orthogonal to the axial direction of the magnetic sensitive member. Therefore, the magneto-impedance sensor element is suitable for the case in which, when mounting the magneto-impedance sensor element to an electronic circuit board or the like, the axial direction of the magnetic sensitive member is to be set in the direction of thickness of the electronic circuit board or the like. In other words, because the surface of the magneto-impedance sensor element on which the electrodes are disposed can be positioned to face in the same direction as that of a mount surface of the electronic circuit board or the like, it is possible to easily perform connection work using leads, etc.

Further, the magneto-impedance sensor element can be fabricated with a two-dimensional process. Therefore, a three-dimensional process requiring a high cost is no longer required, and a cost reduction can be realized.

The magneto-impedance sensor element includes the electromagnetic coil made up of the foil-like conductive patterns arranged in adjacent relation on the outer surface of the insulator which is formed to allow penetration of the magnetic sensitive member therethrough. The conductive patterns forming the electromagnetic coil can be formed in small size with very high efficiency, for example, by a method using vapor deposition of a metal, a method of etching a metallic thin film and selectively removing the metallic thin film, or a method of coating conductive ink. Therefore, the magneto-impedance sensor element can be formed in small size and at a low cost with high accuracy.

Thus, the magneto-impedance sensor element according to the second aspect of the present invention can be obtained as a small-sized, highly-accurate, and low-cost element. Further, the magneto-impedance sensor element is suitable for magnetic sensing in the direction of thickness of the electronic circuit board or the like on which the magneto-impedance sensor element is mounted.

Figure 1:
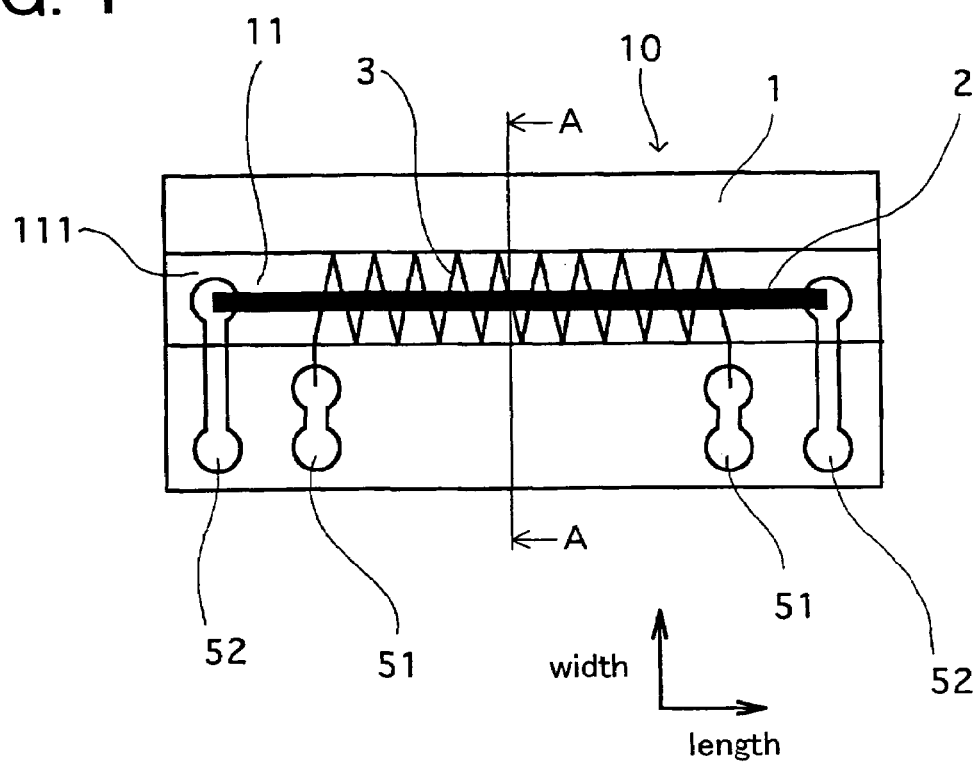
FIG. 1 is a conceptual view showing a front surface of an MI element in Example 1.

REFERENCE NUMERALS 1 electrode-wiring substrate
11 elongate groove
100 IC
101 first sensor
102 second sensor
103 third sensor
2 magnetic sensitive member (amorphous wire)
3 electromagnetic coil
31 first conductive pattern
32 second conductive pattern
4 insulator

BEST MODE FOR CARRYING OUT THE INVENTION

The magnetic sensitive member in each of the three-dimensional magnetic bearing sensor and the magneto-impedance sensor element according to the first and second aspects of the present invention can be made of, for example, an amorphous wire with a diameter of not larger than 50 μm. In this case, the electromagnetic coil can be formed in a smaller cross-sectional area and the size of the magneto-impedance sensor element can be reduced. More preferably, an amorphous wire with a diameter of not larger than 30 μm is employed. Further, FeCoSiB, NiFe, etc. can be used as materials of the magnetic sensitive member.

The magneto-impedance sensor element performs magnetic sensing based on the so-called MI phenomenon that an induced voltage generates in the electromagnetic coil responsive to changes of a current supplied to the magnetic sensitive member. The MI phenomenon occurs in the magnetic sensitive member made of a magnetic material having an electron spin direction in the circumferential direction with respect to the direction of the supplied current. When the current supplied to the magnetic sensitive member is abruptly changed, a magnetic field in the circumferential direction is also abruptly changed, and under the action of the changing magnetic field, the directions of electron spin direction are changed depending on the ambient magnetic field. At the same time, there occur changes in, e.g., internal magnetization and impedance of the magnetic sensitive member. This is the above-mentioned MI phenomenon.

The magneto-impedance sensor element is a element employing the magnetic sensitive member made of a magnetic material having an electron spin direction in the circumferential direction with respect to the direction of the supplied current. When the current supplied to the magnetic sensitive member is abruptly changed, a magnetic field in the circumferential direction is also abruptly changed, and under the action of the changing magnetic field, the directions of electron spin direction are changed depending on the ambient magnetic field. Then, changes occurred in, e.g., internal magnetization and impedance of the magnetic sensitive member at that time are converted to, for example, a voltage or current generated in the magnetic sensitive member or a voltage or current generated at opposite ends of the electromagnetic coil disposed around the magnetic sensitive member.

Also, the magneto-impedance sensor element is preferably constructed such that the intensity of an acting magnetic field is determined by measuring the magnitude of an induced voltage generating at the opposite ends of the electromagnetic coil when the current supplied to the magnetic sensitive member is caused to rise or fall in 10 nano seconds or below.

In such a case, with an abrupt change of the supplied current, it is possible to change the magnetic field in the circumferential direction at a speed comparable to the propagation speed of change in electron spin direction in the magnetic sensitive member, and hence to more reliably develop the MI phenomenon.

With a rise or fall of the supplied current in 10 nano seconds or below, a current change including a high-frequency component of about 0.1 GHz can be caused to act upon the magnetic sensitive member. Then, by measuring the induced voltage generating at the opposite ends of the electromagnetic coil, a resulting change of the internal magnetic field generated in the magnetic sensitive member depending on the ambient magnetic field can be measured as the magnitude of the induced voltage, and the intensity of the ambient magnetic field can be measured with higher accuracy. Here, the term "rise or fall of the supplied current" means that a value of the current supplied to the magnetic sensitive member is changed from 10% or below (or 90% or above) of the steady current value to 90% or above (or 10% or below) thereof.

Preferably, the magneto-impedance sensor element is constructed so as to measure the induced voltage generating at the opposite ends of the electromagnetic coil when the current supplied to the magnetic sensitive member is caused to fall.

The case of abruptly falling the supplied current can provide higher linearity of a signal measured by the magneto-impedance sensor element with respect to the intensity of the magnetic field than the case of raising the supplied current.

In the three-dimensional magnetic bearing sensor according to the first aspect of the present invention, each of the first sensor, the second sensor, and the third sensor may comprise an electrode-wiring substrate having an elongate groove formed therein as a recessed groove, first conductive patterns which are disposed on an inner peripheral surface of the elongate groove to extend across the groove-running direction of the elongate groove and each of which has opposite ends extended to position on the surface of the electrode-wiring substrate, the insulator filled in the elongate groove in a state that an amorphous wire serving as the magnetic sensitive member penetrates the insulator, and second conductive patterns disposed on an outer surface of the insulator in bridging relation to the elongate groove, and the electromagnetic coil may be a combination of one coil portion constituted by each of the first conductive patterns and the other coil portion constituted by each of the second conductive patterns and electrically connecting respective corresponding ends of the first conductive patterns adjacent to each other.

In that case, with a combination of one coil portion constituted by each of the first conductive patterns disposed on the inner peripheral surface of the elongate groove and the other coil portion constituted by each of the second conductive patterns disposed on the outer surface of the insulator, the electromagnetic coil can be formed in very small size. Therefore, each of the first to third sensors has a small size and the three-dimensional magnetic bearing sensor using those sensors can be obtained as a small-sized one with superior mountability.

The conductive patterns on the inner peripheral surface of the elongate groove and the outer surface of the insulator can be formed by metal vapor deposition or etching, for example, with very high efficiency and good accuracy. Hence, the three-dimensional magnetic bearing sensor can be manufactured with excellent production efficiency, high accuracy, and good quality.

The three-dimensional magnetic bearing sensor may include an IC having a substantially rectangular shape with four side wall surfaces and incorporating an electronic circuit formed therein, the first sensor, the second sensor, and the third sensor being all disposed on the IC, and
the third sensor may be disposed on one of the side wall surfaces such that the groove-running direction of the elongate groove is substantially matched with the direction of thickness of the IC.

When the third sensor is disposed on one of the side wall surfaces such that the groove-running direction of the elongate groove is substantially matched with the direction of thickness of the IC, it is possible to efficiently arrange the third sensor for measuring a magnetic field component in the direction of thickness of the IC. On the other hand, the first and second sensors can be mounted onto the surface of the IC, one or more of the side wall surfaces, etc. Because the first and second sensors have their elongate grooves which are required to extend along the surface of the IC, a degree of flexibility in arranging the first and second sensors on the IC is increased in comparison with that in arranging the third sensor.

Preferably, the first sensor and the second sensor are disposed on two of the side wall surfaces of the IC which are orthogonal to each other, and the groove-running direction of the elongate groove of each of the first sensor and the second sensor is substantially orthogonal to the side wall surface on which the other sensor is disposed.

When the first sensor and the second sensor are disposed on the two orthogonal side wall surfaces such that the groove-running direction of the elongate groove of each of the first sensor and the second sensor is substantially orthogonal to the side wall surface on which the other sensor is disposed, magnetic field components in the two orthogonal directions in a plane substantially parallel to the IC can be detected. Further, by using a sensor having the same specifications as, e.g., each of the first and second sensors, the number of types of parts can be reduced.

Preferably, the third sensor has electrodes formed on a surface thereof which is positioned to face the same side as that of the surface of the IC, and the electrodes are electrically connected to electrodes disposed on the surface of the IC via leads.

In that case, since the surface of the third sensor on which the electrodes are disposed is oriented substantially in the same direction as the surface of the IC on which the electrodes are disposed, work for connecting the leads can be facilitated.

Preferably, the third sensor has electrodes formed on a surface thereof which is positioned to face the same side as that of the surface of the IC, and the electrodes are electrically connected to electrodes disposed on the surface of the IC via leads, and each of the first sensor and the second sensor has electrodes
formed on a surface thereof which is positioned to face the same side as that of the surface of the IC, and the electrodes are electrically connected to electrodes disposed on the surface of the IC via leads.

In that case, since the surface of each of the first to third sensors on which the electrodes are disposed is oriented substantially in the same direction as the surface of the IC on which the electrodes are disposed, work for connecting the leads can be facilitated.

The three-dimensional magnetic bearing sensor may have dimensions within 3 mm in length, 3 mm in width and 1.5 mm in height.

When the three-dimensional magnetic bearing sensor is constructed in such a small size, the three-dimensional magnetic bearing sensor is more easily adaptable for portable terminal equipment, e.g., a cellular phone and a PDA. Further, when the three-dimensional magnetic bearing sensor has dimensions within 2.5 mm in length, 2.5 mm in width and 1 mm in height, it can be more easily mounted to the portable terminal equipment.

Preferably, the three-dimensional magnetic bearing sensor includes an IC incorporating an electronic circuit formed therein and a common substrate on which the IC is mounted, the first sensor, the second sensor, and the third sensor being all disposed on the common substrate, and the third sensor is disposed such that the groove-running
    direction of the elongate groove is substantially matched
    with the direction of thickness of the common substrate.

In that case, the first to third sensors can be efficiently arranged together with the IC by employing the common substrate.

Preferably, in each of the first sensor, the second sensor, and the third sensor, the insulator is formed on an outer periphery of an amorphous wire or a magnetic anisotropic thin film serving as the magnetic sensitive member, and the electromagnetic coil is constituted by the conductive patterns arranged on the outer peripheral surface of the insulator.

In that case, since the conductive patterns are formed on the outer peripheral surface of the insulator which receives the magnetic sensitive member penetrating it, the electromagnetic coil can be formed with very high efficiency and high accuracy. Also, by using the electromagnetic coil made up of the conductive patterns formed on the outer peripheral surface of the insulator, each sensor can be formed in very small size. Further, by constituting the three-dimensional magnetic bearing sensor with the use of the first to third sensors each constructed as mentioned above, a small-sized and highly-accurate excellent product can be realized at a low cost with good production efficiency.

Preferably, the three-dimensional magnetic bearing sensor includes an IC having a substantially rectangular shape with four side wall surfaces and incorporating an electronic circuit formed therein, the first sensor, the second sensor, and the third sensor being all disposed on the IC, and the third sensor is surface-mounted to a daughter substrate
    which is disposed on one of the side wall surfaces in
    substantially orthogonal relation to the surface of the IC,
    and a direction in which the magnetic sensitive member in
    the third sensor has a maximum magnetic field detection
    sensitivity is substantially matched with the direction of
    thickness of the IC.

When the third sensor is disposed such that the direction of magnetic field detection sensitivity is substantially matched with the direction of thickness of the IC, a magnetic field component in the direction of thickness of the IC can be measured by the third sensor. Generally, in each of the first to third sensors, the magnetic field detection sensitivity is maximized in the lengthwise direction of the magnetic sensitive member. Further, the daughter substrate may be vertically disposed on the surface of the IC.

The first sensor and the second sensor may be disposed on the surface of the IC.

By disposing the first sensor and the second sensor on the surface of the IC, a further size reduction can be realized in overall bulk of the three-dimensional magnetic bearing sensor.

The third sensor may have electrodes positioned to face a mount surface of the daughter substrate and may be surface-mounted to the daughter substrate in a state that the electrodes are abutted with corresponding electrodes on the daughter substrate.

In that case, electrical connection between the daughter substrate and the third sensor can be realized with higher reliability.

The third sensor may have electrodes positioned to face a mount surface of the daughter substrate and is surface-mounted to the daughter substrate in a state that the electrodes are abutted with corresponding electrodes on the daughter substrate, and each of the first sensor and the second sensor may have
    electrodes positioned to face the surface of the IC and be
    disposed in a state that the electrodes are abutted with
    corresponding electrodes on the IC.

In that case, the first to third sensors can be efficiently arranged with respect to the IC, and a small-sized three-dimensional magnetic bearing sensor can be realized.

The three-dimensional magnetic bearing sensor may have dimensions within 3 mm in length, 3 mm in width and 1.5 mm in height.

When the three-dimensional magnetic bearing sensor is constructed in such a small size, the three-dimensional magnetic bearing sensor is more easily adaptable for portable terminal equipment, e.g., a cellular phone and a PDA. Further, when the three-dimensional magnetic bearing sensor has dimensions within 2.5 mm in length, 2.5 mm in width and 1 mm in height, it can be more easily mounted to the portable terminal equipment.

Preferably, the three-dimensional magnetic bearing sensor includes an IC incorporating an electronic circuit formed therein and a common substrate on which the IC is mounted, the first sensor, the second sensor, and the third sensor being all disposed on the common substrate, and the third sensor is disposed such that a direction in which the magnetic sensitive member in the third sensor has a maximum magnetic field detection sensitivity is substantially matched with the direction of thickness of the common substrate.

In that case, the first to third sensors can be efficiently arranged together with the IC by employing the common substrate.

According to the second aspect of the present invention, the magneto-impedance sensor element may comprise an electrode-wiring substrate serving as the sensor substrate and having an elongate groove formed therein as a recessed groove, first conductive patterns which are disposed on an inner peripheral surface of the elongate groove to extend substantially perpendicularly to the groove-running direction of the elongate groove and each of which has opposite ends extended to position on the surface of the electrode-wiring substrate, the insulator filled in the elongate groove in a state that an amorphous wire serving as the magnetic sensitive member penetrates the insulator, and second conductive patterns disposed on an outer surface of the insulator in bridging relation to the elongate groove, and the electromagnetic coil may be a combination of one coil portion constituted by each of the first conductive patterns and the other coil portion constituted by each of the second conductive patterns and electrically connecting respective corresponding ends of the first conductive patterns adjacent to each other.

In that case, with a combination of one coil portion constituted by each of the first conductive patterns disposed on the inner peripheral surface of the elongate groove and the other coil portion constituted by each of the second conductive patterns disposed on the outer surface of the insulator, the electromagnetic coil can be formed in very small size. Therefore, the magneto-impedance sensor element can be obtained as a small-sized element with superior mountability. Further, the conductive patterns on the inner peripheral surface of the elongate groove and the outer surface of the insulator can be formed by metal vapor deposition or etching, for example, with very high efficiency and good accuracy. Hence, the magneto-impedance sensor element can be manufactured with excellent production efficiency, high accuracy, and good quality.

The magneto-impedance sensor element may comprise an insulator covering an outer periphery of an amorphous wire or a magnetic anisotropic thin film serving as the magnetic sensitive member, the electromagnetic coil constituted by the conductive patterns arranged on the outer peripheral surface of the insulator, and a daughter substrate serving as the sensor substrate on which the insulator receiving the magnetic sensitive member therein is disposed.

In that case, by forming the conductive patterns on the outer peripheral surface of the insulator formed around the magnetic sensitive member, the electromagnetic coil can be formed with very high efficiency and high accuracy. Also, by forming the electromagnetic coil with the conductive patterns disposed on the outer peripheral surface of the insulator, a very small magneto-impedance sensor element can be realized.

Additionally, the conductive patterns constituting the electromagnetic coil can be formed on the outer peripheral surface of the insulator by, e.g., a method using vapor deposition of a metal, a method of etching a vapor-deposited metallic thin film and selectively removing the metallic thin film, or a method of coating conductive ink. At least one of epoxy resin, silicone, etc. can be employed as the insulator.

EXAMPLES

Example 1

This example is related to a three-dimensional magnetic bearing sensor 10a employing a magneto-impedance sensor element 10 with an electromagnetic coil. Details of the three-dimensional magnetic bearing sensor 10a will be described below with reference to FIGS. 1 to 14.

Figure 2:
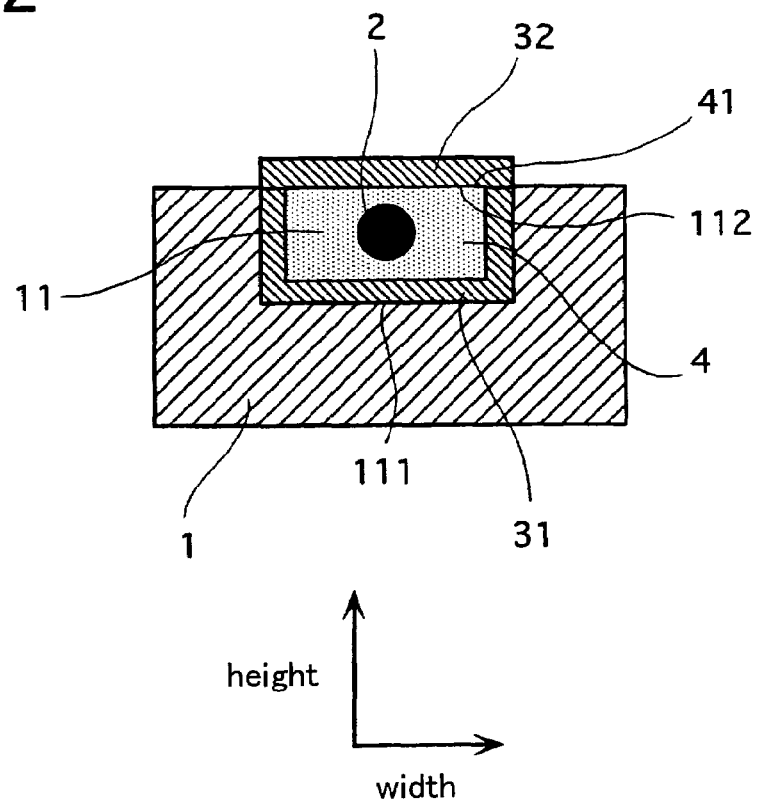
FIG. 2 is a conceptual view showing a section taken along line A-A in FIG. 1 in which the MI element in Example 1 is shown.
Figure 3:
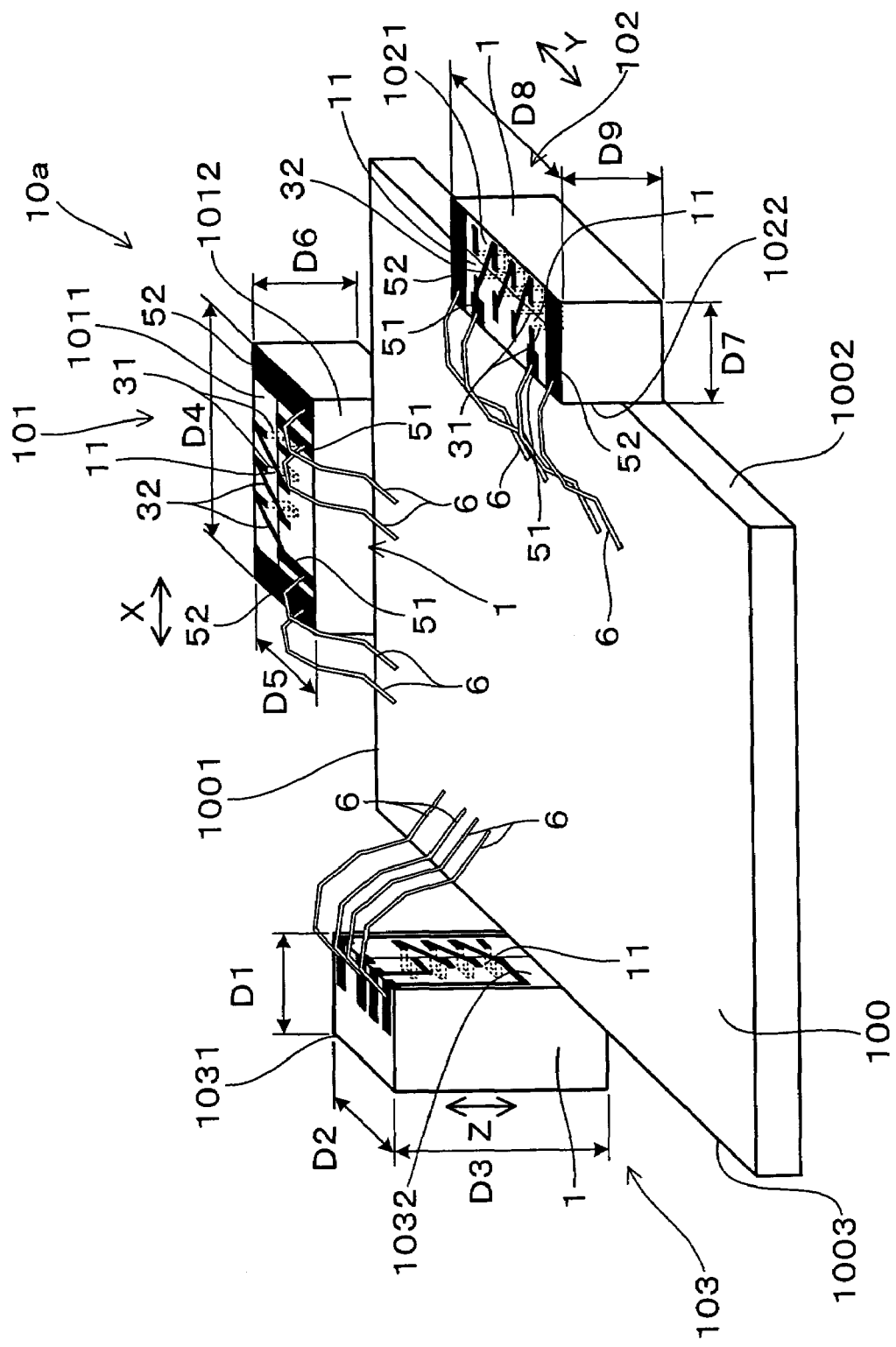
FIG. 3 is a perspective view showing an overall construction of a three-dimensional magnetic bearing sensor in Example 1.

As shown in FIGS. 1 to 3, the three-dimensional magnetic bearing sensor 10a of this example includes a first sensor 101, a second sensor 102, and a third sensor 103 each constituted by the magneto-impedance sensor element 10. The magneto-impedance sensor element 10 comprises a magnetic sensitive member 2 having a characteristic changed responsive to an external magnetic field, an insulator 4 formed to allow penetration of the magnetic sensitive member 2 through it, and an electromagnetic coil 3 made up of foil-like conductive patterns 31, 32 arranged in adjacent relation on an outer surface of the insulator 4.

The first sensor 101, the second sensor 102, and the third sensor 103 are disposed such that directions in which the respective magnetic sensitive members 2 have maximum magnetic field detection sensitivities are substantially orthogonal to each other.

Details of those sensors will be described below.

The magneto-impedance sensor element 10 constituting each of the first sensor 101, the second sensor 102, and the third sensor 103 comprises, as shown in FIGS. 1 and 2, an electrode-wiring substrate 1 having an elongate groove 11 formed therein as a recessed groove, first conductive patterns 31 which are disposed on an inner peripheral surface of the elongate groove 11 to extend substantially perpendicularly to the groove-running direction of the elongate groove 11 and each of which has opposite ends extended to position on the surface of the electrode-wiring substrate 1, the insulator 4 filled in the elongate groove 11 in a state that an amorphous wire serving as the magnetic sensitive member 2 (hereinafter referred to also as an "amorphous wire 2") penetrates the insulator 4, and second conductive patterns 32 disposed on an outer surface of the insulator 4 in bridging relation to the elongate groove 11.

The electromagnetic coil 3 in this example is a combination of one coil portion constituted by each of the first conductive patterns 31 and the other coil portion constituted by each of the second conductive patterns 32 and electrically connecting respective corresponding ends of the first conductive patterns 31 adjacent to each other.

In the three-dimensional magnetic bearing sensor 10a of this example, as shown in FIG. 3, the first sensor 101 is disposed with its amorphous wire 2 extending in the X-direction of an IC 100, the second sensor 102 is disposed with its amorphous wire 2 extending in the Y-direction of the IC 100, and the third sensor 103 is disposed with its amorphous wire 2 extending in the Z-direction of the IC 100.

First, the magneto-impedance sensor element 10 with the electromagnetic coil (hereinafter referred to as the "MI element 10"), which constitutes each of the sensors 101 to 103, will be described below.

The MI element 10 comprises, as shown in FIGS. 1 and 2, the electrode-wiring substrate 1 having the elongate groove 11 formed therein, the amorphous wire 2 having a characteristic changed responsive to a magnetic field acting upon it, the electromagnetic coil 3 wound around the amorphous wire 2 with the insulator 4 interposed between them, and electrodes 52, 51 formed as terminals extended respectively from the amorphous wire 2 and the electromagnetic coil 3.

The amorphous wire 2 is a magnetic wire having a diameter of 20 μm and exhibiting electrical conductivity. In the MI element 10, as shown in FIGS. 1 and 2, the elongate groove 11 formed in the electrode-wiring substrate 1 has a depth of 50 μm and a width of 70 μm, and the amorphous wire 2 is placed in the elongate groove 11 to extend in the groove-running direction. Further, the insulator 4 made of epoxy resin is filled in the elongate groove 11 in which the amorphous wire 2 is placed.

Figure 4:
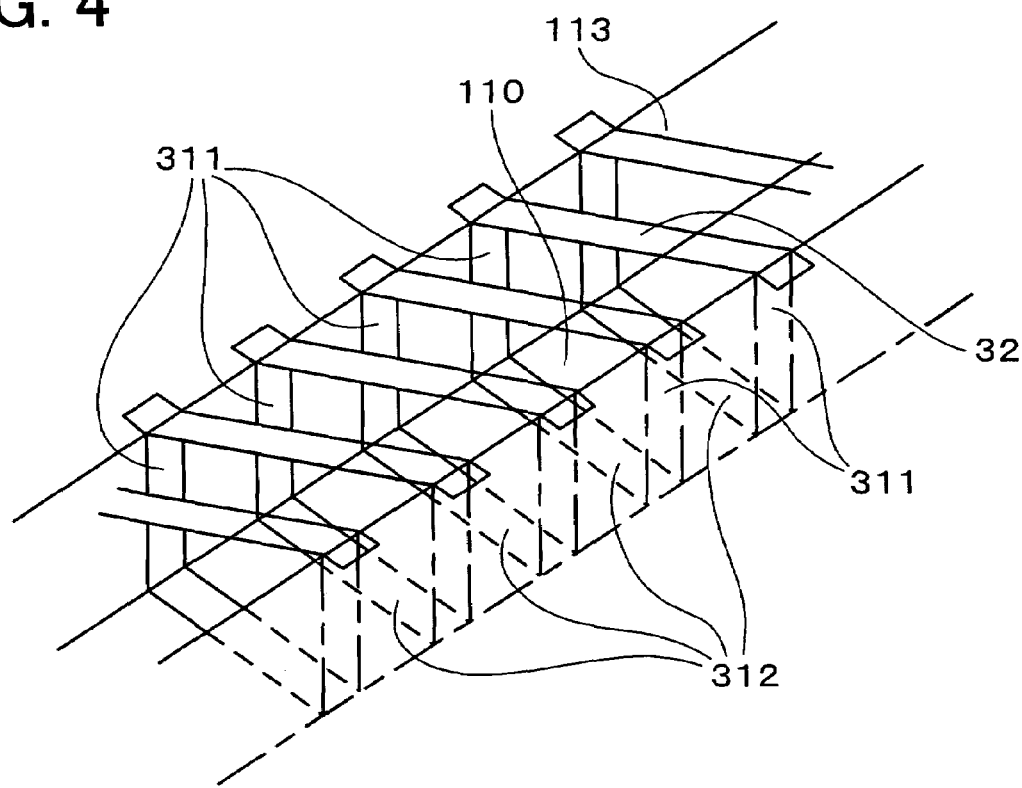
FIG. 4 is a partial perspective view showing an arrangement of an electromagnetic coil in an elongate groove in Example 1.
Figure 5A:
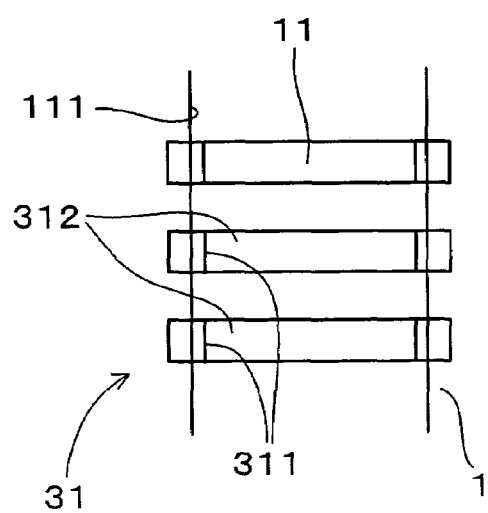
FIG. 5A is a partial plan view showing an arrangement of first conductive patterns in an elongate groove in Example 1.
Figure 5B:
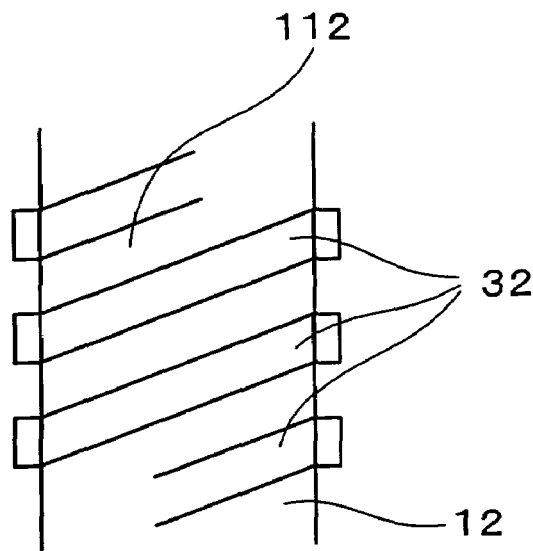
FIG. 5B is a partial plan view showing an arrangement of second conductive patterns in an elongate groove in Example 1.
Figure 6:
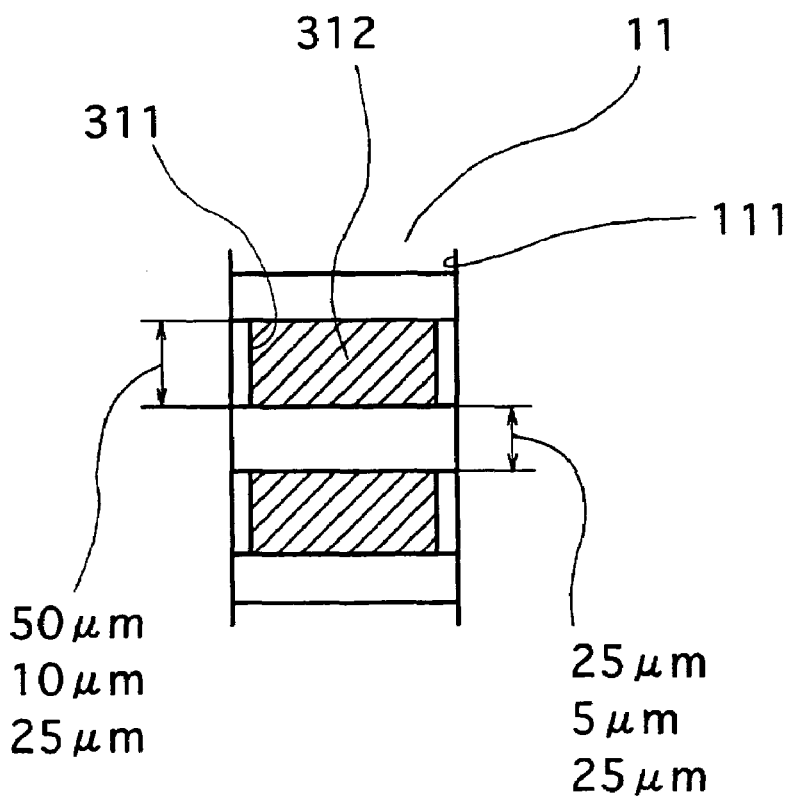
FIG. 6 is a partial plan view showing the arrangement of the electromagnetic coil in the elongate groove in Example 1.

The electromagnetic coil 3 forms a spiral electric path as a whole by, as described above, combining one coil portion constituted by the first conductive pattern 31 disposed on an inner peripheral surface 111 of the elongate groove 11 and the other coil portion constituted by the second conductive pattern 32 which is disposed on the outer surface of the insulator 4 and is extended on the surface of the electrode-wiring substrate 1 in bridging relation to the elongate groove 11. In this example, as shown in FIGS. 4 to 6, the conductive pattern 31 is formed substantially perpendicularly to the groove-running direction of the elongate groove 11. The conductive pattern 32 is formed obliquely relative to the width direction of the elongate groove 11 for electrical connection between the respective corresponding ends of the conductive patterns 31 adjacent to each other. Instead of such an arrangement, the conductive pattern 32 may be disposed to extend in the width direction of the elongate groove 11, and the conductive pattern 31 may be formed obliquely relative to the width direction of the elongate groove 11.

A method of forming the conductive patterns 31 disposed on the inner peripheral surface 111 of the elongate groove 11 will now be described with reference to FIGS. 4 to 6. In this example, a conductive metallic thin film was first vapor-deposited over the entire inner peripheral surface 111 of the elongate groove 11 formed to extend in the lengthwise direction of the electrode-wiring substrate 1 and on vicinity area of the elongate groove 11 on the surface of the electrode-wiring substrate 1. Then, parts of the metallic thin film were selectively removed by selective etching to form the conductive patterns 31 comprising vertical patterns 311 and horizontal patterns 312. More specifically, the vertical patterns 311 were formed to vertically extend on both groove side surfaces 113 of the elongate groove 11, and the horizontal patterns 312 were formed on a groove bottom surface 110 of the elongate groove 11 to interconnect the corresponding vertical patterns 311 positioned to face each other.

When forming the conductive patterns 32 on an upper surface 112 of the elongate groove 11, i.e., an upper surface 41 (see FIG. 2) of the insulator 4, a conductive metallic thin film was first vapor-deposited on the surface of the electrode-wiring substrate 1, in which the elongate groove 11 was filled with the insulator 4, so as to cover an area of the upper surface 112 of the elongate groove 11 and the vicinity thereof. Then, as shown in FIGS. 4 to 6, the metallic thin film was partly removed by selective etching to form the conductive patterns 32 for interconnecting the respective corresponding ends of the conductive patterns 31 adjacent to each other.

Additionally, as shown in FIG. 6, the width of each vertical pattern 311 and each horizontal pattern 312 in the groove-running direction can be set to, e.g., 50 μm or 10 μm, and the width of each gap between the adjacent patterns can be set to, e.g., 25 μm or 5 μm, namely half of the pattern width. As an alternative, the width of each pattern 311, 312 in the groove-running direction may be set to 25 μm, and the width of each gap between the adjacent patterns may be set to the same value, i.e., 25 μm.

In the MI element 10 of this example, the insulator 4 is interposed between the amorphous wire 2 and the electromagnetic coil 3 to maintain electrical insulation between the amorphous wire 2 and the electromagnetic coil 3. Particularly, in this example, the electromagnetic coil 3 is directly formed on an outer periphery of the insulator 4 through which the amorphous wire 2 penetrates.

According to the MI element 10 of this example having the above-described construction, the inner diameter of the electromagnetic coil 3 can be reduced to a very small value of not larger than 200 μm, and therefore a reduction in overall size of the MI element 10 is realized. By employing the amorphous wire 2 with a diameter of 1 to 150 μm, the diameter of the electromagnetic coil 3 can be further reduced.

Then, in this example, the circle-equivalent inner diameter (diameter of a circle having the same cross-sectional area as that of a groove defined by a height and a width) of the electromagnetic coil 3 is set to a very small value, i.e., 66 μm.

Figure 7:
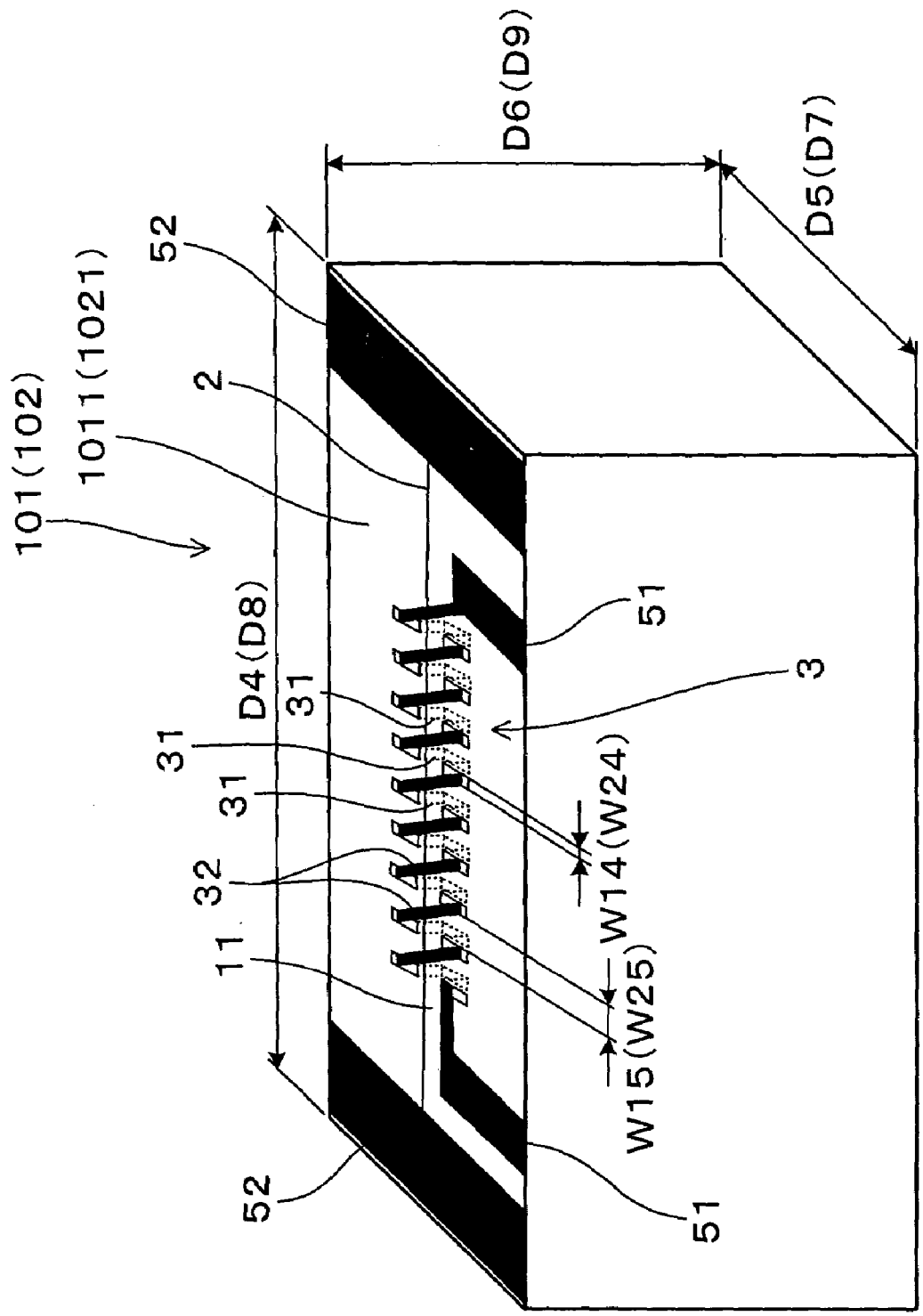
FIG. 7 is a perspective view showing first and second sensors in Example 1.
Figure 8:
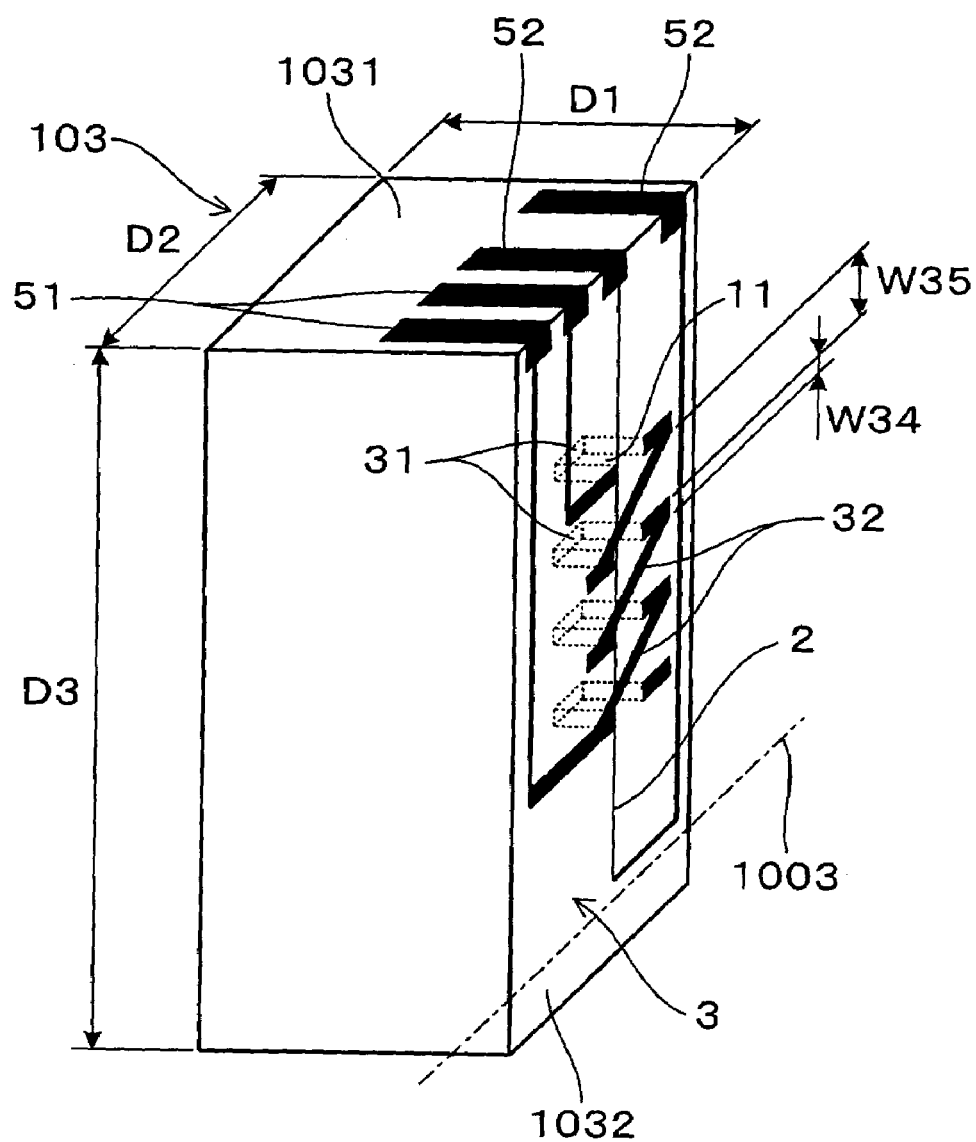
FIG. 8 is a perspective view showing a third sensor in Example 1.

As shown in FIGS. 7 and 8, in each of the first sensor 101, the second sensor 102, and the third sensor 103, the elongate groove 11 is formed in an upper surface 1011, an upper surface 1021, or a side wall surface 1032 thereof, respectively, and the electromagnetic coil 3 is formed to extend in the groove-running direction of the elongate groove 11. Further, the insulator 4 is filled in a space having a substantially rectangular shape in cross-section and being positioned on the inner peripheral side of the electromagnetic coil 3. Moreover, the amorphous wire serving as the magnetic sensitive member 2 penetrates the insulator 4 in the groove-running direction substantially at the center of its cross-section.

In the MI element 10 of this example constituting each of the sensors 101 to 103, the electrode-wiring substrate 1 has dimensions of 0.5 mm×0.4 mm×1.0 mm. The amorphous wire 2 is made of a CoFeSiB-based alloy and has a diameter of 20 μm and a length of 1 mm. The elongate groove 11 is formed to extend in the lengthwise direction of the electrode-wiring substrate 1.

With the construction described above, the first to third sensors 101 to 103 are each realized in dimensions of 0.5 mm×0.4 mm×1.0 mm in this example.

Furthermore, as shown in FIGS. 7 and 8, each sensor 101, 102 and 103 has electrodes 5 formed on each upper surface 1011, 1021 and 1031 of the electrode-wiring substrate 1. The electrodes 5 are in total four, i.e., a pair of electrodes 51 extended from the electromagnetic coil 3 and a pair of electrodes 52 extended from the amorphous wire 2.

As shown in FIG. 7, the electrodes 51 extended from opposite ends of the electromagnetic coil 3 and the electrodes 52 extended from opposite ends of the amorphous wire 2 are disposed on each of the upper surfaces 1011, 1021 of the first sensor 101 and the second sensor 102. In this example, the electrodes 52 were arranged near opposite ends of each sensor 101, 102, and the electrode 51 were arranged between the pair of electrodes 52. In addition, the electrodes 51, 52 are constituted to be electrically connectable to electrode pads (not shown) formed on the IC 100 through respective leads 6 (see FIG. 3).

In the third sensor 103, as shown in FIG. 8, the electrodes 52 extended from opposite ends of the amorphous wire 2 and the electrodes 51 extended from opposite ends of the electromagnetic coil 3 are all arranged on the upper surface 1031 adjacent to the side wall surface 1032 through a sensor's ridgeline located at one end in the lengthwise direction thereof. Those electrodes 51, 52 are extended from the amorphous wire 2 or the electromagnetic coil 3 for electrical connection via respective conductive patterns disposed on the side wall surface 1032. In addition, the electrodes 51, 52 of the third sensor 103 are constituted to be electrically connectable to electrode pads (not shown) formed on the IC 100 through respective leads 6 (see FIG. 3).

Figure 9:
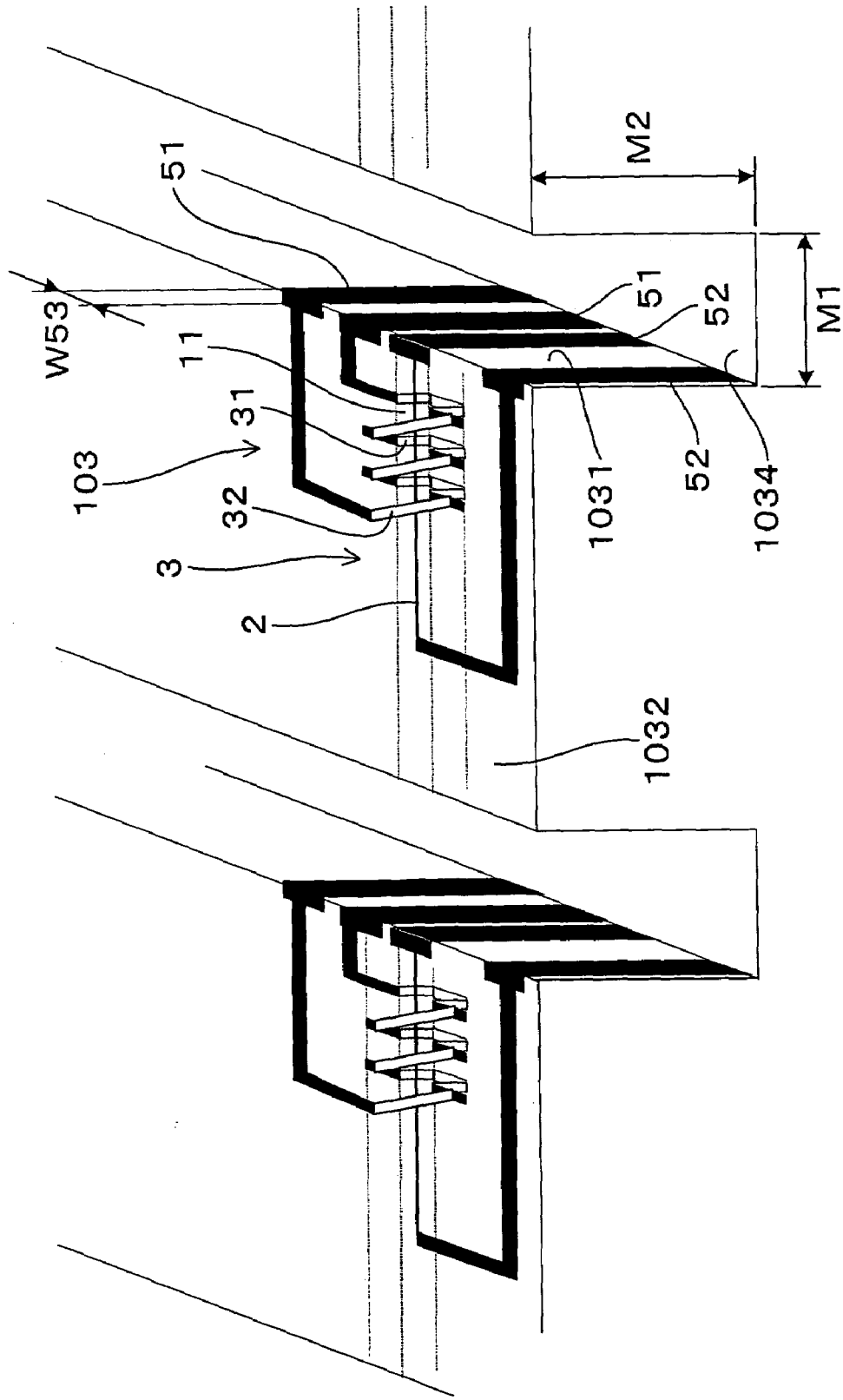
FIG. 9 is a partial perspective view for explaining an electrode formation of the third sensor in Example 1.

A method of forming the electrodes 51, 52 on the upper surface 1031 of the third sensor 103 will now be described with reference to FIG. 9. A groove 1034 having a predetermined width is formed outside each of opposite lengthwise ends of the electrode-wiring substrate 1 constituting the third sensor 103 (FIG. 9 shows only one end as a typical example). In the third sensor 103, the electrodes 51, 52 are formed respectively to extend from the electromagnetic coil 3 or the amorphous wire 2 so as to cover an inner wall surface of the groove 1034, i.e., an end surface of the third sensor 103. The third sensor 103 is obtained by cutting out the electrode-wiring substrate 1 at the groove 1034.

Further, in the third sensor 103, the elongate groove 11 and joint pads are formed on the side surface 1032 by etching or the like. In this example, the third sensor 103 was fabricated by employing a photolithographic process (semiconductor technique).

In a step of joining the third sensor 103 to the IC 100, the pads formed on the side surface 1032 of the third sensor 103 are positioned in abutment with a side wall surface 1003 of the IC 100.

Next, the three-dimensional magnetic bearing sensor 10a of this example is constructed by mounting, to the IC 100, the sensors 101 to 103 each being made of the MI element 10 and substantially in the form of a parallelepiped, as shown in FIG. 3. The first sensor 101 is to measure a magnetic field component in the X-direction, the second sensor 102 is to measure a magnetic field component in the Y-direction, and the third sensor 103 is to measure a magnetic field component in the Z-direction (i.e., the direction of thickness of the IC 100).

The IC 100 is, as shown in FIG. 3, in the form of a rectangular plate having four side wall surfaces in orthogonal relation to each other. In this example, the first sensor 101 and the second sensor 102 are mounted respectively to adjacent side wall surfaces 1001, 1002 of the rectangular plate. Further, the third sensor 103 is mounted to another one of the side wall surfaces of the IC 100, namely a side wall surface 1003 substantially parallel to the side wall surface 1002 (or a side wall surface substantially parallel to the side wall surface 1001).

The first sensor 101 has the elongate groove 11 formed in its upper surface 1011 to extend in the lengthwise direction thereof. Then, the first sensor 101 is mounted in a state that the side wall surface 1012 adjacent to the upper surface 1011 with intermediation of the sensor's ridgeline located at one end in the lengthwise direction is abutted with the side wall surface 1001 of the IC 100.

The second sensor has the elongate groove 11 formed in its lengthwise upper surface 1021 to extend in the lengthwise direction thereof. Then, the second sensor 102 is mounted in a state that the side wall surface 1022 adjacent to the upper surface 1021 with intermediation of the sensor's ridgeline located at one end in the lengthwise direction is abutted with the side wall surface 1002 of the IC 100.

Further, the third sensor has the elongate groove 11 formed in its lengthwise side wall surface 1032 to extend substantially perpendicularly to the lengthwise direction thereof. Then, the third sensor 103 is mounted in a state that the side wall surface 1032 in which the elongate groove 11 is formed is abutted with the side wall surface 1003 of the IC 100.

In this example, of the side wall surfaces of the IC 100, the side wall surface 1001 defines the X-direction, the side wall surface 1002 defines the Y-direction, and the Z-direction is defined in orthogonal relation to both the X- and Y-directions.

Stated another way, as shown in FIG. 3, the first sensor 101 is disposed such that the groove-running direction of its elongate groove 11 is substantially matched with the X-direction. The second sensor 102 is disposed such that the groove-running direction of its elongate groove 11 is substantially matched with the Y-direction. The third sensor 103 is disposed such that the groove-running direction of its elongate groove 11 is substantially matched with the Z-direction.

As mentioned above, each of the first sensor 101 to the third sensor 103 has dimensions of 0.5 mm×0.4 mm×1.0 mm. Therefore, the three-dimensional magnetic bearing sensor 10a of this example, which comprises those small sensors 101 to 103 each constituted by the MI element 10, has very small dimensions of 2.0 mm×1.8 mm×1.0 mm, and hence has a size capable of realizing superior mountability.

Also, in the three-dimensional magnetic bearing sensor of this example, the first sensor 101 and the second sensor 102 are electrically connected to the IC 100 via the respective leads 6 which are connected to the electrodes 51, 52 formed on their upper surfaces 1011, 1021. Further, the third sensor 103 is electrically connected to the IC 100 via the respective leads 6 which are connected to the electrodes 51, 52 formed on its upper surface 1031. Thus, in the three-dimensional magnetic bearing sensor, efficient electrical connection to the IC 100 side is realized by utilizing the electrodes 51, 52 formed on the respective upper surfaces 1011, 1021 and 1031 of the sensors 101, 102 and 103.

In each of the sensors 101 to 103, an external magnetic field acting upon the magnetic sensitive member 2 is detected by measuring a voltage generated in the electromagnetic coil when a high-frequency wave or a pulse current is applied to the amorphous wire 2.

Figure 10:
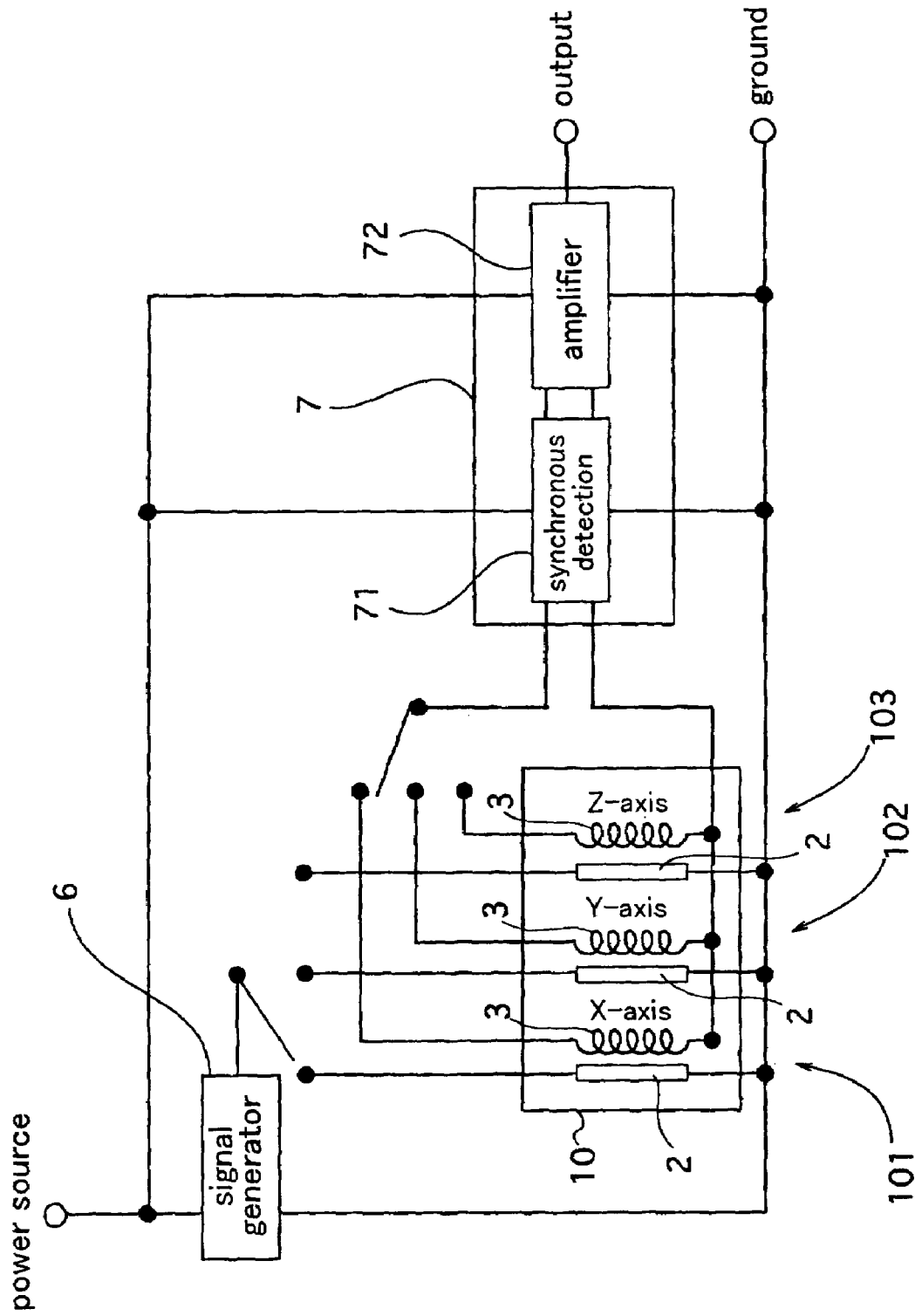
FIG. 10 is a block circuit diagram showing an electronic circuit for a three-dimensional magnetic bearing sensor in Example 1.

The three-dimensional magnetic bearing sensor 10a of this example has an integrated electronic circuit shown in FIG. 10. The electronic circuit is designed to make a current change in a high-frequency range act upon the amorphous wire 2 and to measure an induced voltage that is generated in the electromagnetic coil 3 at that time, thereby measuring the intensity of the acting magnetic field.

The electronic circuit comprises a signal generator 6, the sensors 101 to 103, and a signal processing circuit 7.

The signal generator 6 generates, at signal intervals of 1 μsec, a pulse signal including mainly 200 MHz and having the intensity of 170 mA. The electronic circuit applies the pulse signal to the amorphous wire 2. Each of the sensors 101 to 103 utilizes the phenomenon that a voltage is induced in the electromagnetic coil 3 depending on an external magnetic field acting upon the amorphous wire 2. The induced voltage in the electromagnetic coil 3 generates at the time of rise or fall of the pulse signal.

The signal processing circuit 7 is a circuit designed so as to process the induced voltage of the electromagnetic coil 3. In the signal processing circuit 7, the induced voltage of the electromagnetic coil 3 is taken out through synchronous detection 71 that is turned on/off in sync with the pulse signal, and the taken-out induced voltage is amplified by an amplifier 72 at a predetermined amplification factor. Then, the signal amplified by the signal processing circuit 7 is output as an output signal of the electronic circuit. In this example, a cutoff time required for the pulse signal to fall from 90% to 10% of a steady-state value was set to 4 nano seconds.

Figure 12:
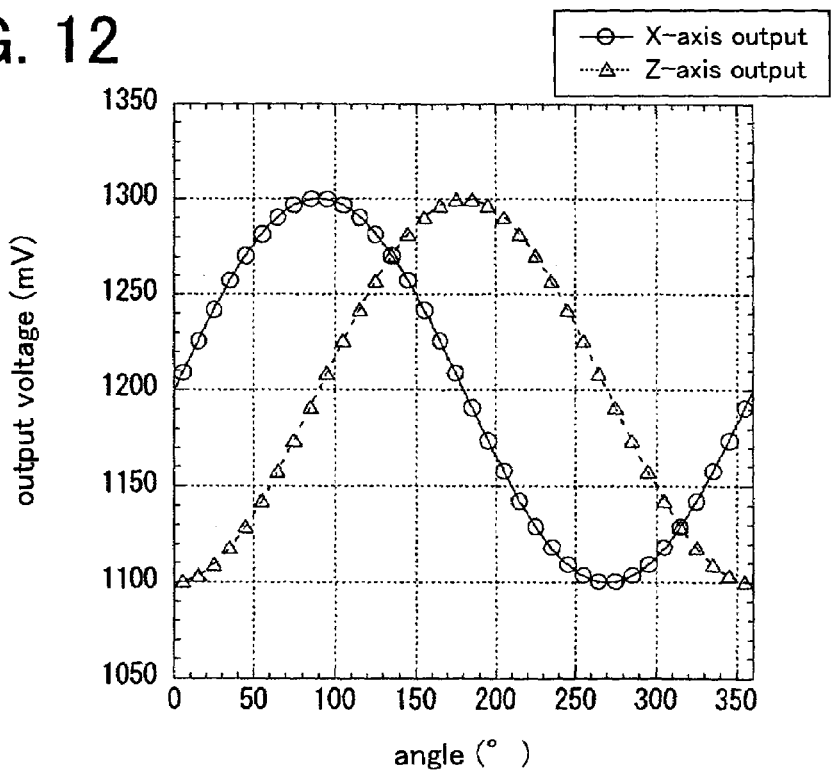
FIG. 12 is a graph showing X- and Z-axis outputs detected by the three-dimensional magnetic bearing sensor in Example 1.
Figure 13:
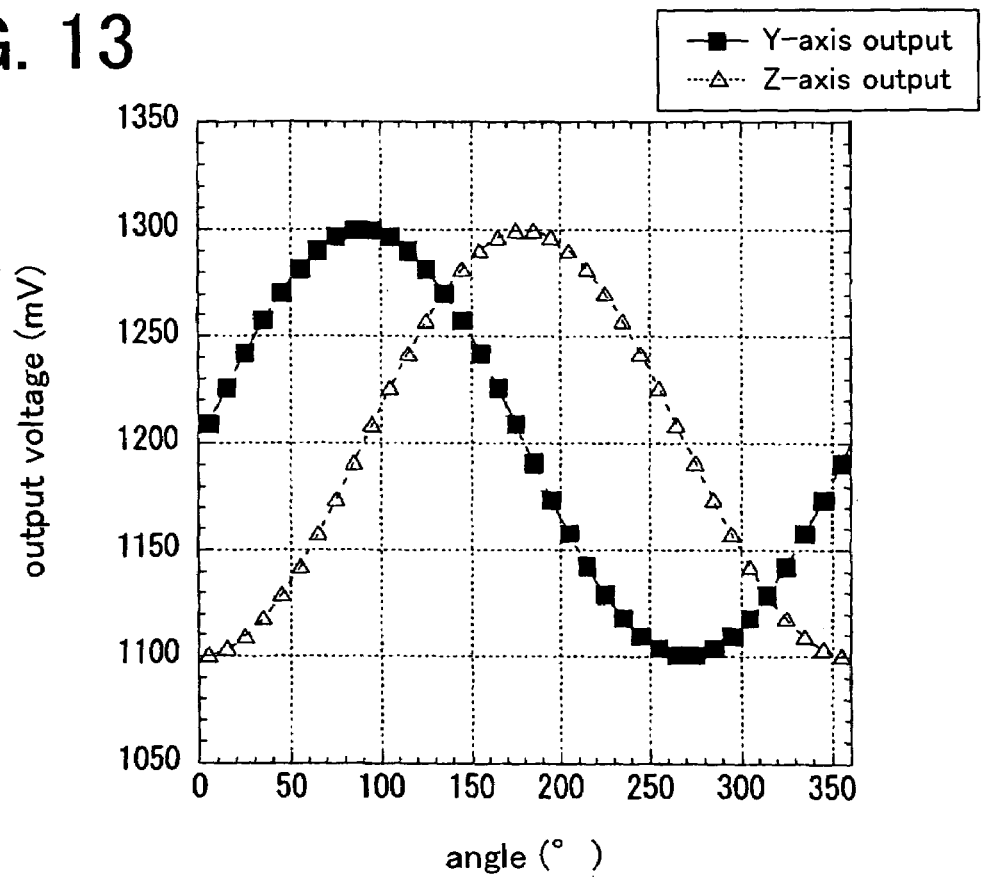
FIG. 13 is a graph showing Y- and Z-axis outputs detected by the three-dimensional magnetic bearing sensor in Example 1.
Figure 14A:
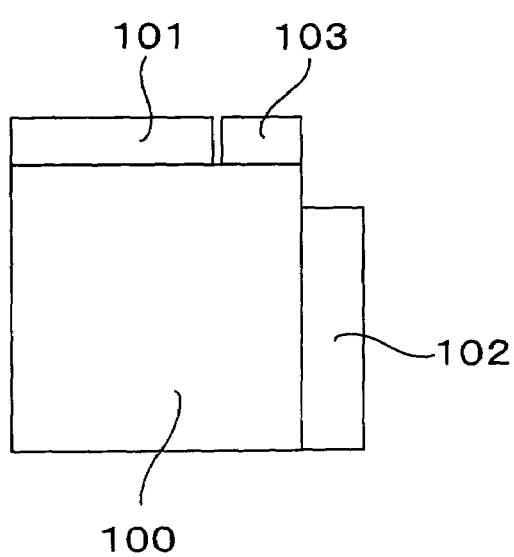
FIG. 14A is a plan view showing a construction of another three-dimensional magnetic bearing sensor in Example 1.
Figure 14B:
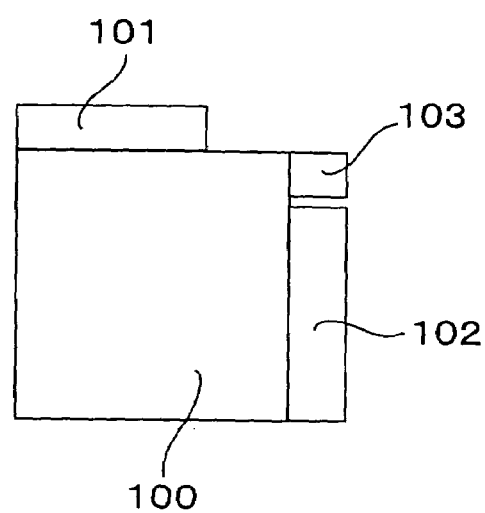
FIG. 14B is a plan view showing a construction of still another three-dimensional magnetic bearing sensor in Example 1.
Figure 14C:
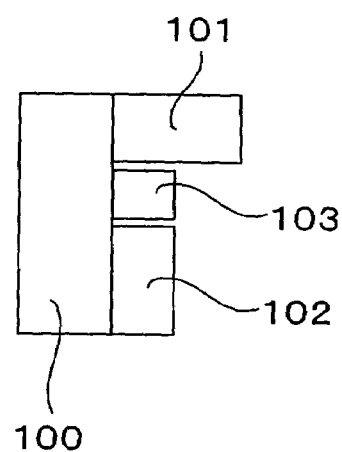
FIG. 14C is a plan view showing a construction of still another three-dimensional magnetic bearing sensor in Example 1.
Figure 14D:
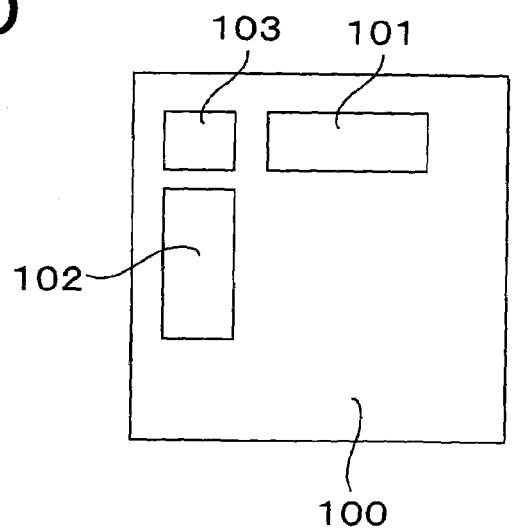
FIG. 14D is a plan view showing a construction of still another three-dimensional magnetic bearing sensor in Example 1.

Thus, in the three-dimensional magnetic bearing sensor 10*a* of this example, respective magnetic field components in the X-, Y- and -Z directions are detected by using three MI elements 10 (i.e., the first sensor 101, the second sensor 102, and the third sensor 103) disposed in the predetermined positions of the IC 10. Further, in the three-dimensional magnetic bearing sensor 10*a* of this example, the sensors 101 to 103 output X-, Y- and Z-axis outputs having respective phases different from each other, as shown in FIGS. 11 to 13, to the signal processing circuit 7 (FIG. 10) formed in the IC 100.

Figure 11:
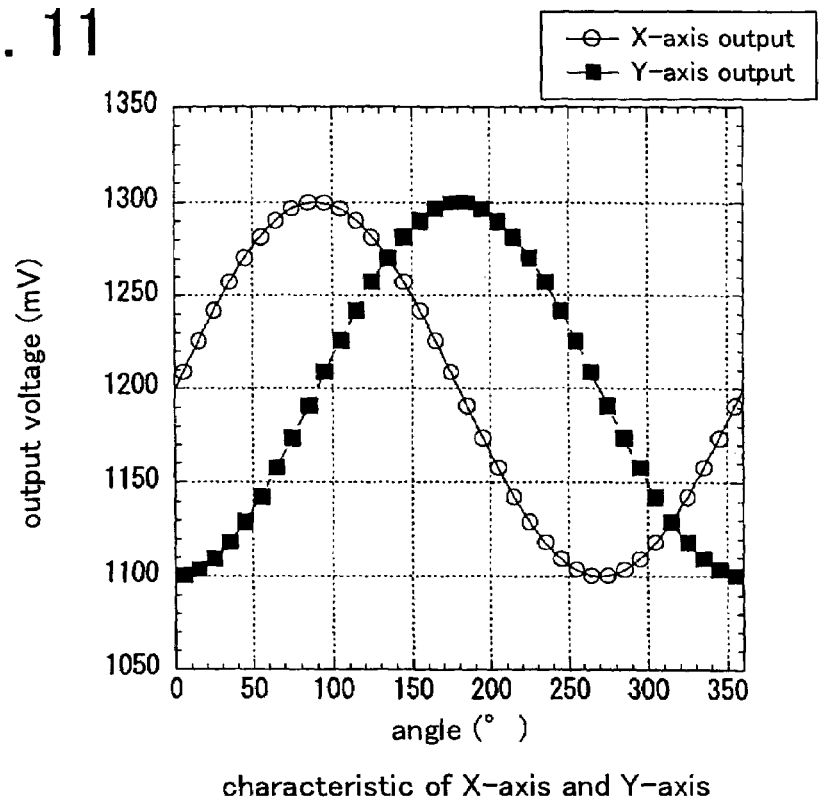
FIG. 11 is a graph showing X- and Y-axis outputs detected by the three-dimensional magnetic bearing sensor in Example 1.

FIG. 11 shows changes in output signals of a horizontal component of terrestrial magnetism, which were detected by the first sensor 101 and the second sensor 102 when rotating the three-dimensional magnetic bearing sensor 10*a* through 360 degrees about the Z-axis in which the elongate groove 11 of the Z-axis direction sensor, i.e., the third sensor 103, was oriented in the vertical direction. Also, FIG. 12 shows changes in output signals detected by the first sensor 101 and the third sensor 103 when rotating the three-dimensional magnetic bearing sensor 10*a* about the Y-axis in which the elongate groove 11 of the Y-axis direction sensor, i.e., the second sensor 102, was oriented in the vertical direction. Further, FIG. 13 shows changes in output signals detected by the second sensor 102 and the third sensor 103 when rotating the three-dimensional magnetic bearing sensor 10*a* about the X-axis in which the elongate groove 11 of the X-axis direction sensor, i.e., the first sensor 101, was oriented in the vertical direction. In the graphs of FIGS. 11 to 13, the horizontal axis represents a rotational angle about each axis, and the vertical axis represents a magnitude of the output signal of each sensor 101, 102 and 103.

With the three-dimensional magnetic bearing sensor 10*a*, simultaneous magnetic sensing in the X-, Y- and Z-directions, which has faced a difficulty in the related art, can be performed by employing three MI elements 10 with high accuracy while realizing a reduction in size. Accordingly, the three-dimensional magnetic bearing sensor 10*a* can detect an external magnetic field acting upon it with high accuracy regardless of the sensor posture.

Particularly, in the three-dimensional magnetic bearing sensor 10*a* of this example, the third sensor 103 is fabricated with a two-dimensional process and is joined to one side surface of the IC 100 by bonding while the third sensor 103 is held upright. Therefore, a three-dimensional process requiring a high cost is no longer required, and a cost reduction can be realized.

Further, the MI element 10 has a structure utilizing the elongate groove 11 formed in the electrode-wiring substrate 1. Accordingly, the sensor size can be reduced as compared with the case of arranging, for example, a bobbin including an electromagnetic coil wound around it on the electrode-wiring substrate 1. It is also possible to prevent the electromagnetic coil 3 from being externally touched, and to improve mechanical stability.

Moreover, in this example, the amorphous wire 2 is used as the magnetic sensitive member. By utilizing the amorphous wire 2 with superior magnetic sensitivity, the output voltage per winding of the electromagnetic coil 3 can be further increased, and hence the number of windings can be further reduced. This means that the axial length of the MI element 10 can be further shortened. In the MI element 10 of this example, the winding pitch of the electromagnetic coil 3 is realized at 50 μm, i.e., a value not larger than 100 μm.

By thus reducing the winding pitch of the electromagnetic coil 3 and increasing the number of windings per coil length, the output voltage can be increased. In other words, that effect of increasing the output voltage can be obtained by setting the winding pitch per unit length of the electromagnetic coil 3 to be not larger than 100 μm as in this example. Then, the length of the MI element 10 can be relatively reduced with respect to the output voltage.

Still further, in the three-dimensional magnetic bearing sensor 10*a*, the first sensor 101 and the second sensor 102 are disposed respectively on the adjacent side wall surfaces 1001, 1002 of the IC 100 that is substantially in the rectangular form and has four side wall surfaces. The third sensor 103 is disposed on one 1003 of the remaining two side wall surfaces.

As described above, in the three-dimensional magnetic bearing sensor of this example, the sensors 101 to 103 are arranged in an efficient way. In addition, since sensors having the same specifications are employed as the first sensor 101 and the second sensor 102, the number of types of parts constituting the three-dimensional magnetic bearing sensor 10*a* can be restrained and hence a cost reduction is realized.

While this example employs the third sensor 103 differing in shape and dimensions from the first and second sensors 101, 102, the first to third sensors 101 to 103 may be all designed to have the same shape and dimensions instead.

While, in this example, the first sensor 101 and the second sensor 102 are disposed on the adjacent side wall surfaces 1001, 1002 of the IC 100 and the third sensor 103 is disposed on one of the remaining two side wall surfaces of the IC 100, the third sensor 103 may be disposed on the side wall surface 1001 instead, on which the first sensor 101 is disposed, as shown in FIG. 14 ((A) of FIG. 14). Also, the third sensor 103 may be disposed on the side wall surface 1002 on which the second sensor 102 is disposed (FIG. 14(B)). Alternatively, the first to third sensors 101 to 103 may be disposed on the same side wall surface (FIG. 14(C)), or the first to third sensors 101 to 103 may be disposed on an upper (or lower) surface of the IC 100 (FIG. 14(D)).

Example 2

In this example, characteristics of each of the sensors 101 to 103 (see FIG. 3; hereinafter referred to as a "novel structure sensor") constituting the three-dimensional magnetic bearing sensor 10a of Example 1 were evaluated. Details of the evaluation will be described below with reference to FIGS. 15 and 16.

In this example, the novel structure sensor was evaluated by using a similar electronic circuit to that in Example 1.

Figure 16:
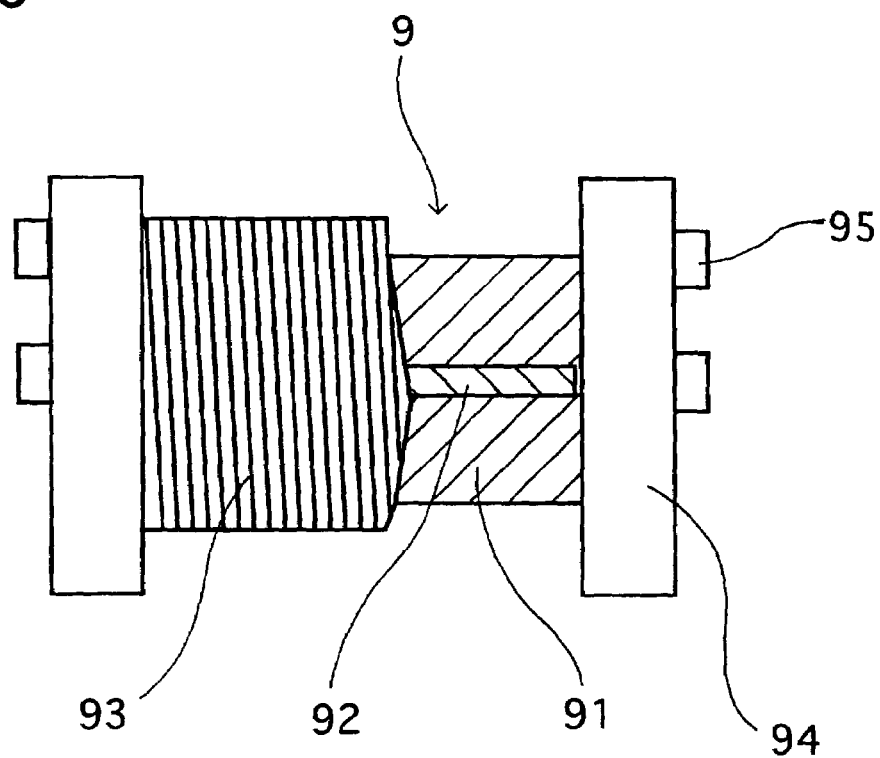
FIG. 16 is a front view showing a bobbin-type MI element used for comparison in Example 2.

For comparison with the novel structure sensor in this example, a known sensor shown in FIG. 16, i.e., a bobbin element 9 constituted by a known bobbin-type MI element, was employed as a comparative example. The bobbin element 9 comprises an amorphous wire 92 and an electromagnetic coil 93 with an insulating winding frame (bobbin) 94 interposed between them, to thereby maintain electrical insulation. The amorphous wire 92 used here as the magnetic sensitive member is made of a CoFeSiB-based alloy and has a diameter of 30 μm.

The electromagnetic coil 93 has an inner diameter of 1.5 mm. The winding frame 94 is provided with two electrodes 95 extended from electromagnetic coil 93 and other two electrodes 95 extended from the amorphous wire 92. The bobbin element 9 has dimensions of 3 mm×2 mm×4 mm. Thus, the known bobbin element 9 has a large bulk. The known sensor of the comparative example using the known bobbin element 9, therefore, has a difficulty in application to portable equipment or the like having a limited space for installation.

Figure 15:
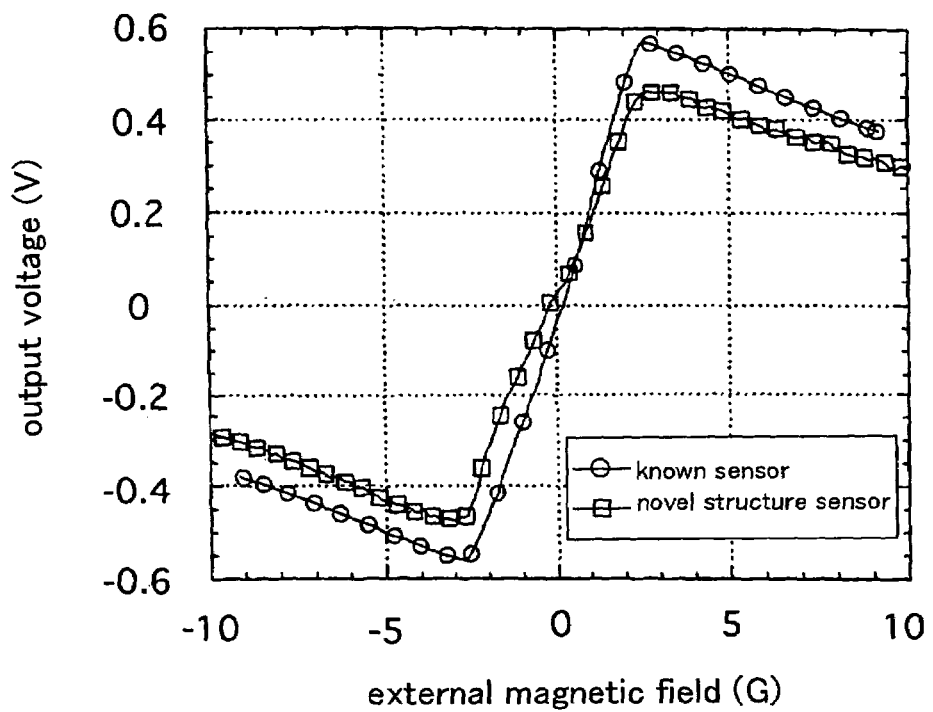
FIG. 15 is a graph showing the relationship between an external magnetic field acting upon a magnetic sensor employing an MI element and an output voltage in Example 2.

FIG. 15 shows results of comparing a magnetic detection characteristic between the known sensor constituted by the known bobbin element 9 (wire length; 2.5 mm, coil diameter; 1.5 mm, and 40 turns) and the novel structure sensor (wire diameter; 20 μm, wire length; 1.0 mm, coil diameter (circle-equivalent diameter); 66 μm, and 18 turns). In FIG. 15, the horizontal axis represents an external magnetic field, and the vertical axis represents an output voltage from the signal processing circuit.

As seen from FIG. 15, the known sensor and the novel structure sensor of this example have linear ranges substantially equal to each other, i.e., about ±3 G, and the output voltage of the novel structure sensor of this example is 80% or more of that of the known sensor. Thus, in the novel structure sensor of this example, a lowering of the output voltage is restrained for a reduction in size and thickness. The MI element constituting the novel structure sensor of this example is superior in voltage per turn to the bobbin element 9. Comparing with 28 mV/turn of the bobbin element 9, the MI element constituting the novel structure sensor of this example produces about twice voltage per turn, i.e., 53 mV/turn.

In other words, in spite of having a size much smaller than, i.e., about 1/50 of, the known sensor constituted by the bobbin element 9, the novel structure sensor of this example has a superior characteristic, as shown in FIG. 15, that a good linearity is obtained in the magnetic field range of ±3 G.

The other construction and operating advantages are the same as those in Example 1.

Example 3

In this example, each of the sensors 101 to 103 constituting the three-dimensional magnetic bearing sensor of Example 1 was evaluated for a characteristic in detection of terrestrial magnetism. Details of the evaluation will be described below with reference to FIGS. 3, 7 to 9, and Tables 1 to 4.

D5 in FIGS. 3 and 7 denotes the width of the first sensor 101, D4 denotes the length of the first sensor 101 in the lengthwise direction, and D6 denotes the height of the first sensor 101.

Also, D7 in FIGS. 3 and 7 denotes the width of the second sensor 102, D8 denotes the length of the second sensor 102 in the lengthwise direction, and D9 denotes the height of the second sensor 102.

Further, D1 in FIGS. 3 and 8 denotes the width of the third sensor 103, D2 denotes the length of the third sensor 103 in the lengthwise direction, and D3 denotes the height of the third sensor 103.

Table 1 lists, for the various dimensions D1 to D9 shown in FIG. 3, design values, values actually measured in the sensors, and allowable values (dimension allowable ranges) in units of mm.

[Table 1]

TABLE 1

|  | design values | values actually measured | allowable values | unit |
| --- | --- | --- | --- | --- |
| D1 | 0.6 | 0.4~0.9 | 0.2~1.2 | mm |
| D2 | 1.2 | 0.5~1.5 | 0.3~2.0 | mm |
| D3 | 1.0 | 0.8~1.2 | 0.3~2.5 | mm |
| D4 | 1.0 | 0.6~1.6 | 0.2~2.5 | mm |
| D5 | 0.5 | 0.2~1.0 | 0.2~2.0 | mm |
| D6 | 0.4 | 0.2~0.6 | 0.2~2.5 | mm |
| D7 | 0.5 | 0.3~1.1 | 0.2~2.0 | mm |
| D8 | 1.0 | 0.8~1.5 | 0.2~2.5 | mm |
| D9 | 0.4 | 0.2~0.8 | 0.2~2.5 | mm |

Further, W34 in FIG. 8 denotes the width of each of the conductive patterns 31 formed on the inner peripheral surface 111 of the elongate groove 11 which is formed in the third sensor 103, and W35 denotes the pitch of the conductive patterns 31 adjacent to each other.

Table 2 lists, for the various dimensions D1 to D3, W34 and W35 shown in FIG. 8, design values, values actually measured in the sensors, and allowable values (dimension allowable ranges) in units of mm.

[Table 2]

TABLE 2

|  | design values | values actually measured | allowable values | unit |
| --- | --- | --- | --- | --- |
| D1 | 0.6 | 0.2~0.8 | 0.2~1.2 | mm |
| D2 | 1.2 | 0.6~1.6 | 0.3~2.0 | mm |
| D3 | 1.0 | 0.5~1.4 | 0.3~2.5 | mm |
| W34 | 0.025 | 0.010~0.050 | 0.005~0.100 | mm |
| W35 | 0.025 | 0.015~0.040 | 0.005~0.100 | mm |

D6 (D9) in FIG. 7 denotes the height of the first sensor 101 (second sensor 102), D5 (D7) denotes the width of the first sensor 101 (second sensor 102), and D4 (D8) denotes the length of the first sensor 101 (second sensor 102) in the lengthwise direction.

W14 (W24) in FIG. 7 denotes the width of each of the conductive patterns 31 formed on the inner peripheral surface 111 of the elongate groove 11 which is formed in the first sensor 101 (second sensor 102) to extend in the lengthwise direction of the electrode-wiring substrate 1, and W15 (W25) denotes the array pitch of the conductive patterns 31 adjacent to each other.

Table 3 lists, for the various dimensions D4 to D6, W14 and W15 (D7 to D9, W24 and W25) shown in FIG. 7, design values, values actually measured in the sensors, and allowable values (dimension allowable ranges) in units of mm.

[Table 3]

TABLE 3

|         | design values | values actually measured | allowable values | unit |
|---------|---------------|--------------------------|------------------|------|
| D4(D7)  | 0.5           | 0.2~0.8                  | 0.2~1.0          | mm   |
| D5(D8)  | 0.5           | 0.3~1.0                  | 0.2~2.0          | mm   |
| D6(D9)  | 1.5           | 0.9~2.1                  | 0.3~2.5          | mm   |
| W14(W24)| 0.025         | 0.015~0.055              | 0.005~0.100      | mm   |
| W15(W25)| 0.025         | 0.015~0.060              | 0.005~0.100      | mm   |

M1 in FIG. 9 denotes the width of the groove 1034 formed in the process of manufacturing the third sensor 103, M2 denotes the depth of the groove 1034, and W53 denotes the width of each of the electrodes 51, 52 formed to extend on the wall surface of the groove 1034. As mentioned above, the third sensor 103 is obtained by dividing the substrate at the groove 1034 in a later step.

Table 4 lists, for the various dimensions M1, M2 and W53 shown in FIG. 9, design values, values actually measured in the sensors, and allowable values (dimension allowable ranges) in units of mm.

TABLE 4

|     | design values | values actually measured | allowable values | unit |
|-----|---------------|--------------------------|------------------|------|
| M1  | 0.15          | 0.08~0.6                 | 0.05~1.2         | mm   |
| M2  | 0.15          | 0.10~0.3                 | 0.03~2.0         | mm   |
| W53 | 0.1           | 0.07~0.3                 | 0.03~2.5         | mm   |

The other construction and operating advantages are the same as those in Example 1.

Example 4

This example represents a modification in which the construction of the MI element 10 is modified on the basis of Example 1. Details of this modification will be described below with reference to FIGS. 17 to 21.

Figure 17:
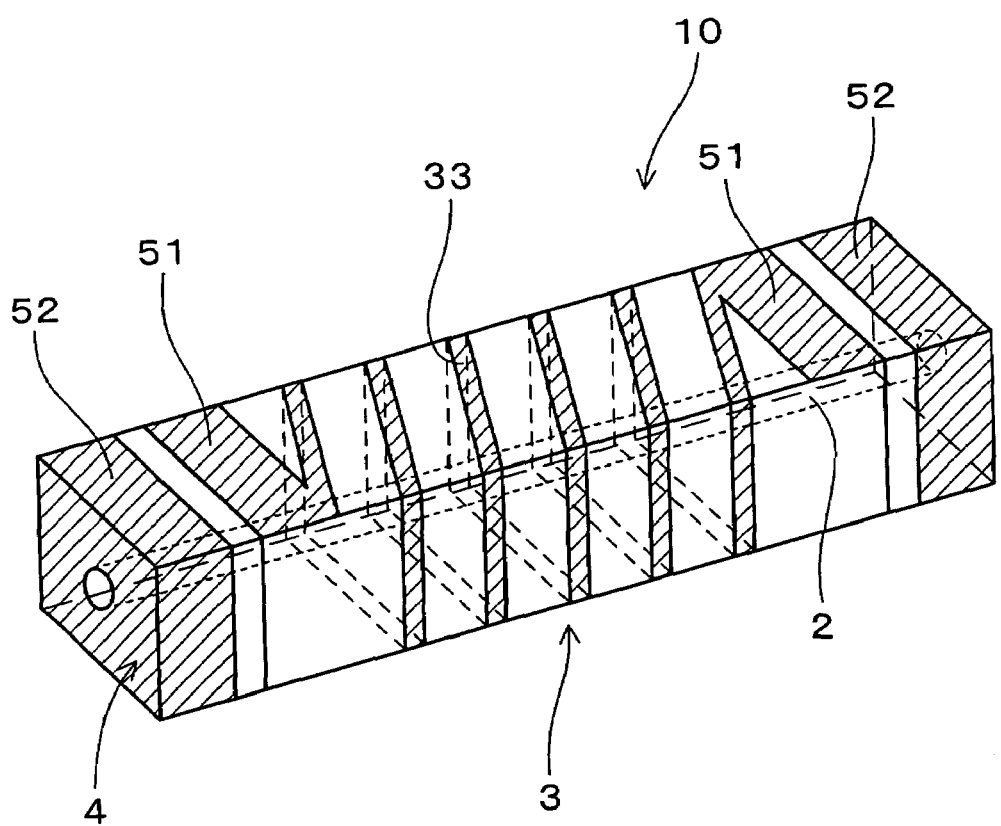
FIG. 17 is a perspective view showing the insulator in Example 4 in which a metallic thin film is removed in a ring-shaped area near each of opposite ends of the insulator.

In an MI element 10 of this example, as shown in FIG. 17, the electromagnetic coil 3 is formed on an outer peripheral surface of the insulator 4 disposed around the amorphous wire 2. The electromagnetic coil 3 is formed by conductive patterns 33 disposed on the outer peripheral surface of the insulator 4.

Figure 18:
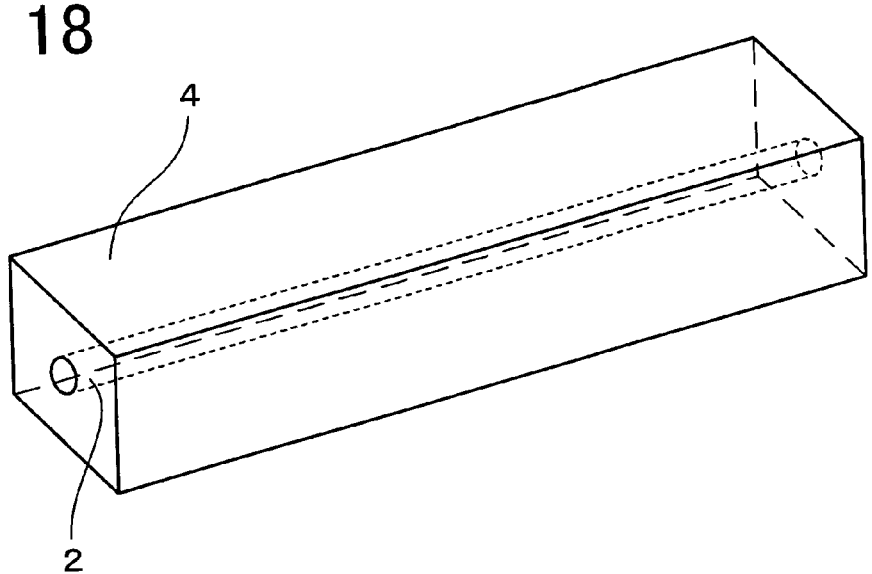
FIG. 18 is a perspective view showing an MI element in Example 4.

In this example, as shown in FIG. 18, the insulator 4 made of resin was formed by molding around the amorphous wire 2. The insulator 4 is in the form of a rod having a rectangular cross-section, and opposite ends of the amorphous wire 2 are exposed at opposite end surfaces of the insulator 4.

Subsequently, in this example, the electromagnetic coil 3 was formed through the following steps. First, a metal material containing copper was vapor-deposited all over the outer peripheral surface of the rod-shaped insulator 4, thereby forming a metallic thin film. Then, the metallic thin film was partly removed by selective etching to form the electromagnetic coil 3. At the same time as forming the electromagnetic coil 3, in this example, electrodes 52 extended from the opposite ends of the amorphous wire 2 and electrodes 51 extended from opposite ends of the electromagnetic coil 3 were also formed.

Figure 19:
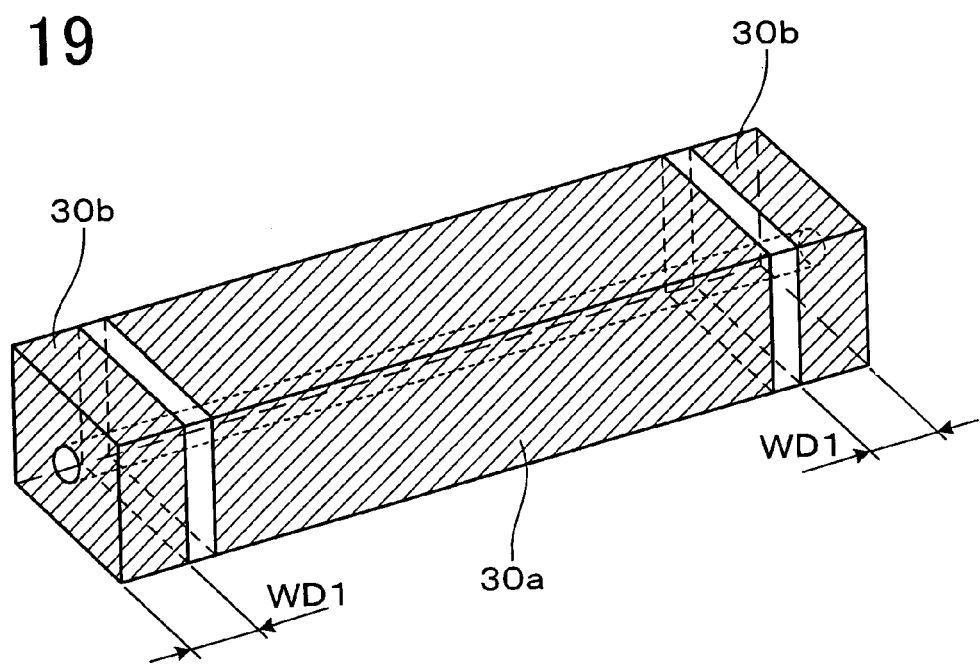
FIG. 19 is a perspective view showing an insulator molding around the amorphous wire in Example 4.

More specifically, as shown in FIG. 19, the metallic thin film was removed in ring-shaped areas at positions away from opposite ends of the insulator 4 by a predetermined distance WD1, thus dividing the metallic thin film into three parts.

Thereafter, selective etching was performed on an intermediate metallic thin film 30a to form the conductive patterns 33 constituting the electromagnetic coil 3 and the electrodes 51 extended from the opposite ends of the electromagnetic coil 3.

Metallic thin films 30b at the opposite ends of the electromagnetic coil 3 are electrically connected to the corresponding ends of the amorphous wire 2 penetrating the insulator 4 and function as the electrodes 52 for the amorphous wire 2.

Figure 20:
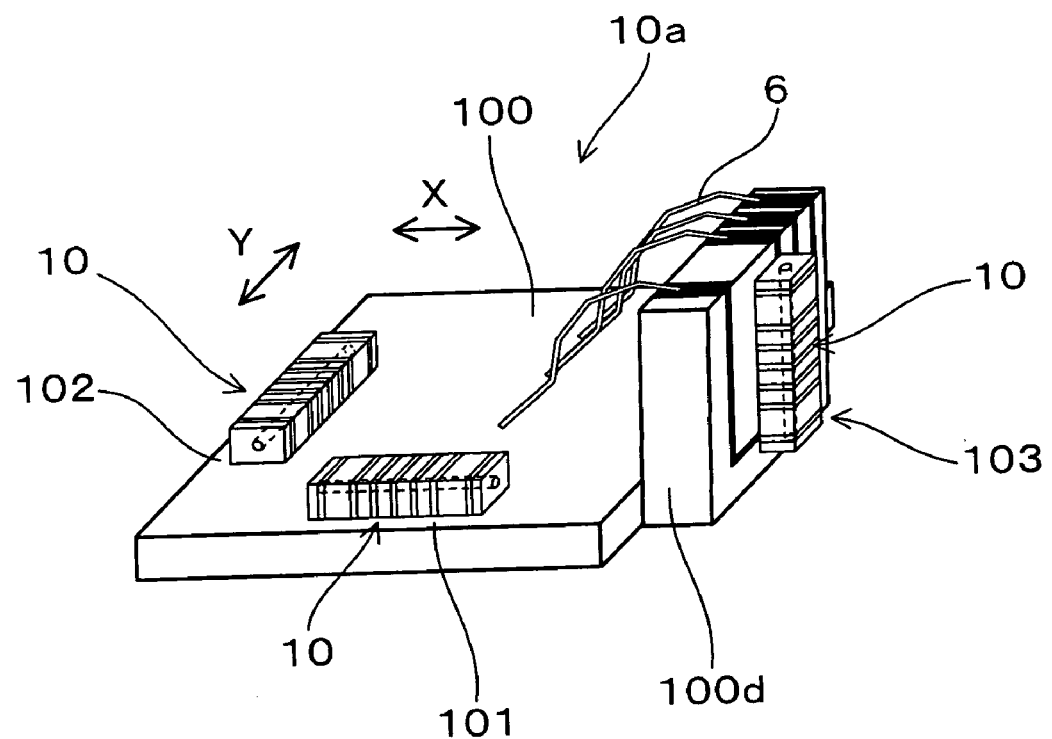
FIG. 20 is a perspective view showing a three-dimensional magnetic bearing sensor in Example 4.

A three-dimensional magnetic bearing sensor 10a of this example is constructed, as shown in FIG. 20, by employing three MI elements 10 directly or indirectly disposed on the IC 100. Two MI elements 10 are disposed on the surface of the IC 100 to serve respectively as a first sensor 101 and a second sensor 102 for measuring the intensities of a magnetic field in the X- and Y-directions, i.e., two orthogonal directions in the surface of the IC 100. Also, a third sensor 103 for measuring the intensity of a magnetic field in the Z-direction, i.e., the direction of thickness of the IC 100, is constituted by surface-mounting the MI element 10 to a daughter substrate 100d. The third sensor 103 is joined to one side wall surface of the IC 100 by employing pads formed on a rear surface of the daughter substrate 100d.

Figure 21:
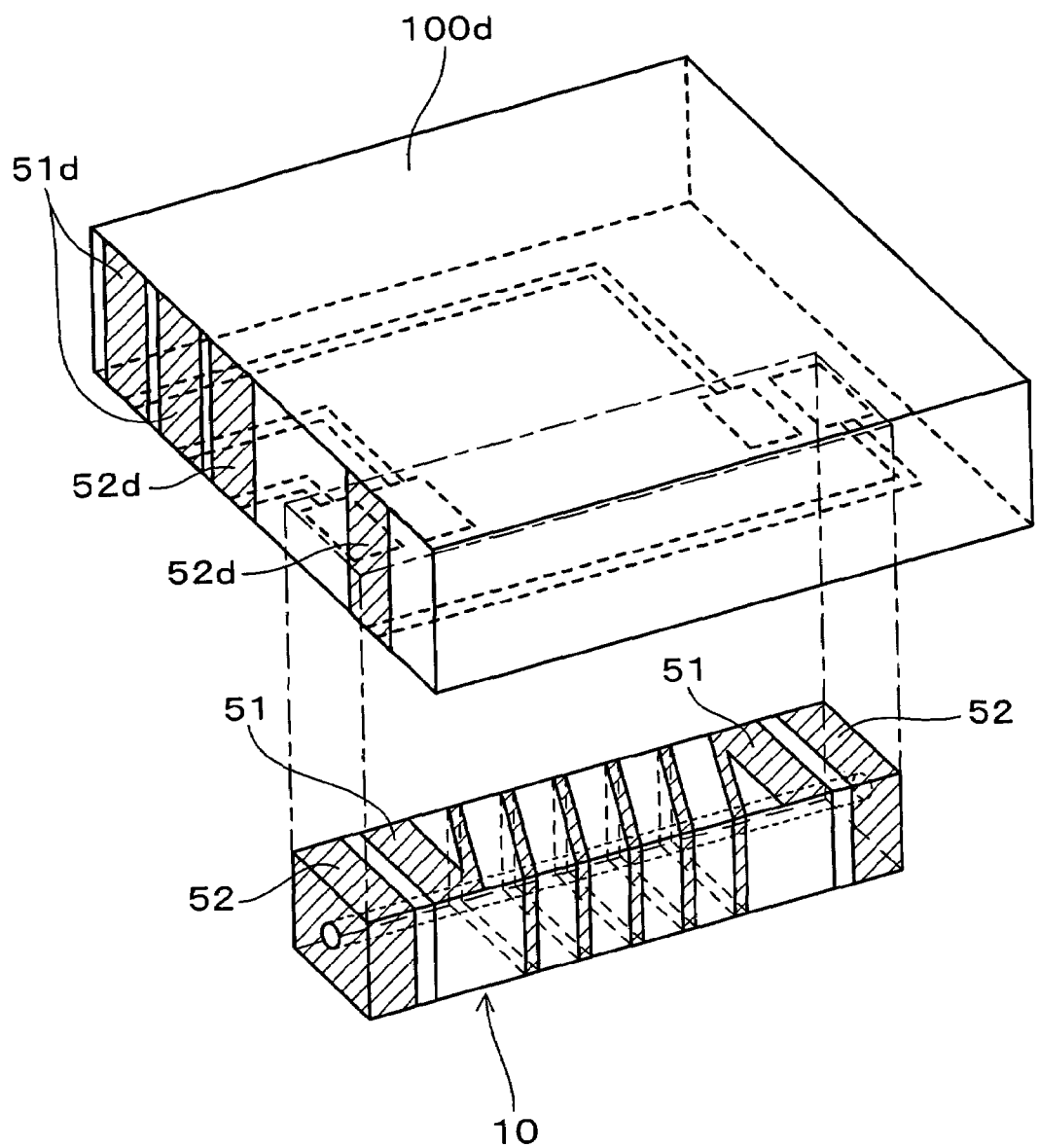
FIG. 21 is a combination view for explaining an MI element and a daughter substrate in Example 4.

A method of forming the third sensor 103 constituted by the MI element 10 surface-mounted to the daughter substrate 100d will now be described with reference to FIG. 21. The daughter substrate 100d has electrodes formed corresponding to the electrodes 51, 52 of the MI element. Further, electrodes 51d, 52d extended respectively from those electrodes on the daughter substrate 100d are disposed on one side wall surface thereof. The electrodes 51d, 52d are constituted to be electrically connectable to corresponding electrodes (not shown) of the IC 100 via similar leads to those used in Example 1.

The other construction and operating advantages are the same as those in Example 1.

Instead of the amorphous wire 2 of this example, a member in the form of a thin film, i.e., a magnetic anisotropic thin film, can also be used. In this case, the magnetic anisotropic thin film is covered with the insulator 4 to have a substantially rectangular cross-section. Then, the electromagnetic coil 33 and the electrodes 51, 52 are formed through the same steps as those described above.

Example 5

This example represents a modification in which a method of arranging the sensors 101 to 103 is modified on the basis of the three-dimensional magnetic bearing sensor 10a of Example 1 or 4. Details of this modification will be described below with reference to FIGS. 22 to 23.

A three-dimensional magnetic bearing sensor 10a of this example has a common substrate 109 on which the IC 100 and the sensors 101 to 103 are all disposed.

Figure 22:
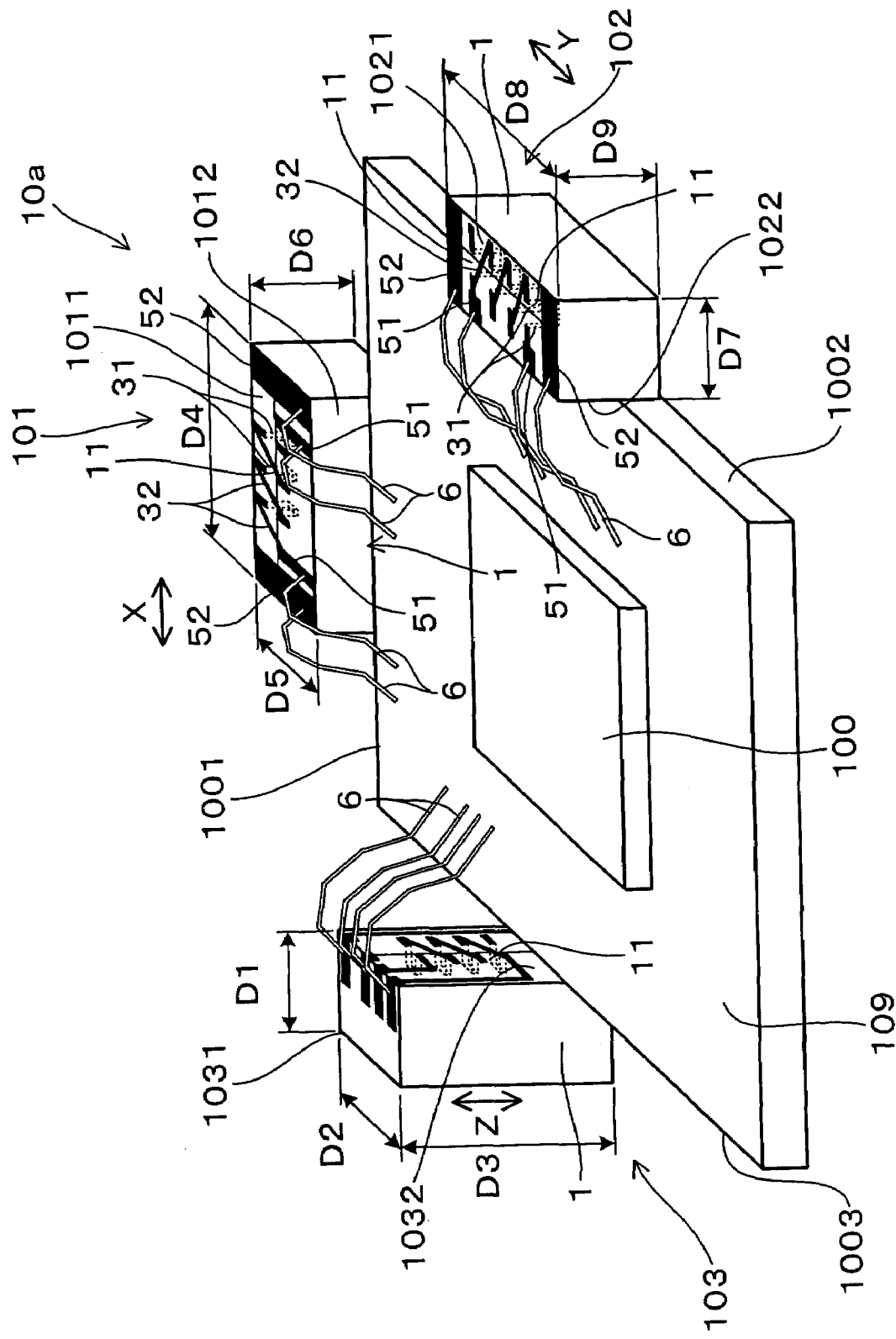
FIG. 22 is a perspective view showing an overall construction of a three-dimensional magnetic bearing sensor No. 1 in Example 5.

The three-dimensional magnetic bearing sensor 10a shown in FIG. 22 is constructed on the basis of Example 1 by mounting the IC 100 on a mount surface of the common substrate 109, and by arranging the first sensor 101, the second sensor 102, and the third sensor 103 onto side wall surfaces of the common substrate 109.

Figure 23:
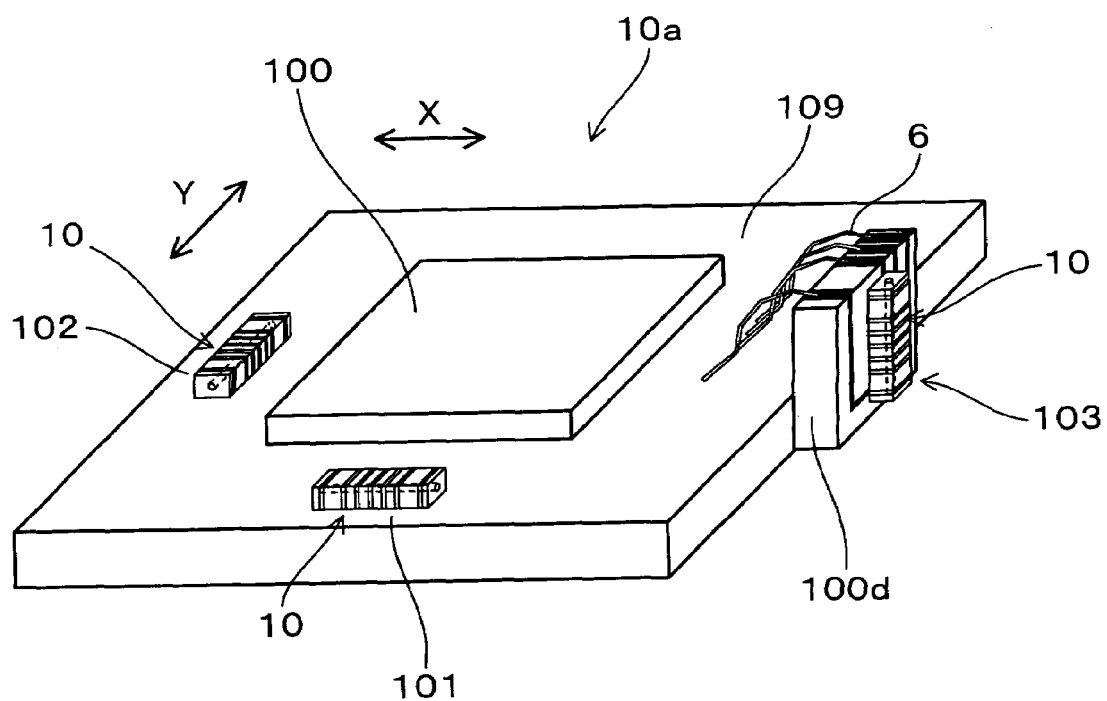
FIG. 23 is a perspective view showing an overall construction of a three-dimensional magnetic bearing sensor No. 2 in Example 5.

The three-dimensional magnetic bearing sensor 10a shown in FIG. 23 is constructed on the basis of the three-dimensional magnetic bearing sensor of Example 4 by mounting the IC 100 on the mount surface of the common substrate 109, and by arranging the first sensor 101, the second sensor 102, and the third sensor 103 onto the side wall surfaces of the common substrate 109.

The other construction and operating advantages are the same as those in Example 1 or 4.

The invention claimed is:

1. A three-dimensional magnetic bearing sensor including a first sensor, a second sensor, and a third sensor each constituted by a magneto-impedance sensor element comprising a magnetic sensitive member having a characteristic changed responsive to an external magnetic field, an insulator formed to allow penetration of said magnetic sensitive member therethrough, and an electromagnetic coil made up of foil-like conductive patterns arranged in adjacent relation on an outer surface of said insulator,
   wherein said first sensor, said second sensor, and said third sensor are disposed such that directions in which said magnetic sensitive members in respective sensors have maximum magnetic field detection sensitivities are substantially orthogonal to each other,
   wherein each of said first sensor, said second sensor, and said third sensor comprises an electrode-wiring substrate having an elongate groove formed therein as a recessed groove, first conductive patterns which are disposed on an inner peripheral surface of said elongate groove to extend across the groove-running direction of said elongate groove and each of which has opposite ends extended to position on the surface of said electrode-wiring substrate, said insulator filled in said elongate groove in a state that an amorphous wire serving as said magnetic sensitive member penetrates said insulator, and second conductive patterns disposed on an outer surface of said insulator in bridging relation to said elongate groove, and
   wherein said electromagnetic coil is a combination of one coil portion constituted by each of said first conductive patterns and the other coil portion constituted by each of said second conductive patterns and electrically connecting respective corresponding ends of said first conductive patterns adjacent to each other.

2. A three-dimensional magnetic bearing sensor according to claim 1, wherein said three-dimensional magnetic bearing sensor includes an IC having a substantially rectangular shape with four side wall surfaces and incorporating an electronic circuit formed therein, said first sensor, said second sensor, and said third sensor being all disposed on said IC, and
   wherein said third sensor is disposed on one of said side wall surfaces such that the groove-running direction of said elongate groove is substantially matched with the direction of thickness of said IC.

3. A three-dimensional magnetic bearing sensor according to claim 2, wherein said third sensor has electrodes formed on a surface thereof which is positioned to face the same side as that of the surface of said IC, and said electrodes are electrically connected to electrodes disposed on the surface of said IC via leads.

4. A three-dimensional magnetic bearing sensor according to claim 2, wherein said first sensor and said second sensor are disposed on two of the side wall surfaces of said IC which are orthogonal to each other, and the groove-running direction of said elongate groove of each of said first sensor and said second sensor is substantially orthogonal to the side wall surface on which the other sensor is disposed.

5. A three-dimensional magnetic bearing sensor according to claim 4, wherein said third sensor has electrodes formed on a surface thereof which is positioned to face the same side as that of the surface of said IC, and said electrodes are electrically connected to electrodes disposed on the surface of said IC via leads, and
   wherein each of said first sensor and said second sensor has electrodes formed on a surface thereof which is positioned to face the same side as that of the surface of said IC, and said electrodes are electrically connected to electrodes disposed on the surface of said IC via leads.

6. A three-dimensional magnetic bearing sensor according to claim 5, wherein said three-dimensional magnetic bearing sensor has dimensions within 3 mm in length, 3 mm in width and 1.5 mm in height.

7. A three-dimensional magnetic bearing sensor according to claim 1, wherein said three-dimensional magnetic bearing sensor includes an IC incorporating an electronic circuit formed therein and a common substrate on which said IC is mounted, said first sensor, said second sensor, and said third sensor being all disposed on said common substrate, and
   wherein said third sensor is disposed such that the groove-running direction of said elongate groove is substantially matched with the direction of thickness of said common substrate.

8. A three-dimensional magnetic bearing sensor including a first sensor, a second sensor, and a third sensor each constituted by a magneto-impedance sensor element comprising a magnetic sensitive member having a characteristic changed responsive to an external magnetic field, an insulator formed to allow penetration of said magnetic sensitive member therethrough, and an electromagnetic coil made up of foil-like conductive patterns arranged in adjacent relation on an outer surface of said insulator,
   wherein said first sensor, said second sensor, and said third sensor are disposed such that directions in which said magnetic sensitive members in respective sensors have maximum magnetic field detection sensitivities are substantially orthogonal to each other, wherein in each of said first sensor, said second sensor, and said third sensor, said insulator is formed on an outer periphery of an amorphous wire or a magnetic anisotropic thin film serving as said magnetic sensitive member, and said electromagnetic coil is constituted by said conductive patterns arranged on the outer peripheral surface of said insulator,
   wherein said three-dimensional magnetic bearing sensor includes an IC having a substantially rectangular shape with four side wall surfaces and incorporating an electronic circuit formed therein, said first sensor, said second sensor, and said third sensor being all disposed on said IC,
   wherein said third sensor is surface-mounted to a daughter substrate which is disposed on one of said side wall surfaces in substantially orthogonal relation to the surface of said IC, and a direction in which said magnetic sensitive member in said third sensor has a maximum magnetic field detection sensitivity is substantially matched with the direction of thickness of said IC,
   wherein said first sensor and said second sensor are disposed on the surface of said IC, and
   wherein said third sensor has electrodes positioned to face a mount surface of said daughter substrate and is surface-mounted to said daughter substrate in a state that said electrodes are abutted with corresponding electrodes on said daughter substrate.

9. A three-dimensional magnetic bearing sensor according to claim 8, wherein each of said first sensor and said second sensor has electrodes positioned to face the surface of said IC and is disposed in a state that said electrodes are abutted with corresponding electrodes on said IC.

10. A three-dimensional magnetic bearing sensor according to claim 9, wherein said three-dimensional magnetic bearing sensor has dimensions within 3 mm in length, 3 mm in width and 1.5 mm in height.

11. A magneto-impedance sensor element made by winding an electromagnetic coil around a magnetic sensitive member having a characteristic changed responsive to an external magnetic field, wherein said magneto-impedance sensor element comprises a sensor substrate for holding said magnetic sensitive member, an insulator formed to allow penetration of said magnetic sensitive member therethrough, and an electromagnetic coil made up of foil-like conductive patterns arranged in adjacent relation on an outer surface of said insulator, and wherein said sensor substrate has electrodes extended from said electromagnetic coil and said magnetic sensitive member, said electrodes being formed on one of outer surfaces of said sensor substrate which is substantially orthogonal to the axial direction of said magnetic sensitive member.

12. A magneto-impedance sensor element according to claim 11, wherein said magneto-impedance sensor element comprises an electrode-wiring substrate serving as said sensor substrate and having an elongate groove formed therein as a recessed groove, first conductive patterns which are disposed on an inner peripheral surface of said elongate groove to extend substantially perpendicularly to the groove-running direction of said elongate groove and each of which has opposite ends extended to position on the surface of said electrode-wiring substrate, said insulator filled in said elongate groove in state that an amorphous wire serving as said magnetic sensitive member penetrates said insulator, and second conductive patterns disposed on an outer surface of said insulator in bridging relation to said elongate groove, and wherein said electromagnetic coil is a combination of one coil portion constituted by each of said first conductive patterns and the other coil portion constituted by each of said second conductive patterns and electrically connecting respective corresponding ends of said first conductive patterns adjacent to each other.

13. A magneto-impedance sensor element according to claim 11, wherein said magneto-impedance sensor element comprises an insulator covering an outer periphery of an amorphous wire or a magnetic anisotropic thin film serving as said magnetic sensitive member, said electromagnetic coil constituted by said conductive patterns arranged on the outer peripheral surface of said insulator, and a daughter substrate serving as said sensor substrate on which said insulator receiving said magnetic sensitive member therein is disposed.

* * * * *